United States Patent
Hashimoto

(10) Patent No.: US 8,693,254 B2
(45) Date of Patent: Apr. 8, 2014

(54) NON-VOLATILE SEMICONDUCTOR MEMORY DEVICE

(75) Inventor: Toshifumi Hashimoto, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 13/597,498

(22) Filed: Aug. 29, 2012

(65) Prior Publication Data

US 2013/0194868 A1    Aug. 1, 2013

(30) Foreign Application Priority Data

Jan. 30, 2012    (JP) .................................. 2012-016105

(51) Int. Cl.
*G11C 11/34*    (2006.01)

(52) U.S. Cl.
USPC .................................................. 365/185.17

(58) Field of Classification Search
USPC .................... 365/185.17, 196, 185.19, 185.2
See application file for complete search history.

(56) References Cited

U.S. PATENT DOCUMENTS

| | | | |
|---|---|---|---|
| 5,606,527 A | | 2/1997 | Kwack et al. |
| 6,307,778 B1 | | 10/2001 | Micheloni et al. |
| 2002/0060920 A1 * | | 5/2002 | Tanaka et al. .................. 365/49 |
| 2002/0145907 A1 | | 10/2002 | Byeon et al. |
| 2004/0105327 A1 | | 6/2004 | Tanno |
| 2012/0051134 A1 | | 3/2012 | Shiga |

FOREIGN PATENT DOCUMENTS

| | | |
|---|---|---|
| JP | 7-192500 | 7/1995 |
| JP | 7-240099 | 9/1995 |
| JP | 2001-135100 | 5/2001 |
| JP | 2002-304900 | 10/2002 |
| JP | 2004-178724 | 6/2004 |
| JP | 2012-48795 | 3/2012 |

* cited by examiner

*Primary Examiner* — Jason Lappas
(74) *Attorney, Agent, or Firm* — Oblon, Spivak, McClelland, Maier & Neustadt, L.L.P.

(57) ABSTRACT

A limiter circuit compares a voltage of a control gate line and a set voltage, thereby switching the logic of a flag signal. A booster circuit starts or stops its operation according to the logic of the flag signal. A leak reference circuit has a function of leaking a leak reference current from the control gate line. A counter generates a first count value by counting the number of times the flag signal logic changes in a condition that a word-line transfer transistor is rendered non-conductive and a leak reference circuit is driven, while the counter generates a second count value by counting the number of times the flag signal logic changes in a condition that the word-line transfer transistor is rendered conductive and the leak reference circuit is undriven. A comparator compares the first count value and the second count value.

20 Claims, 20 Drawing Sheets

| D4 | D3 | D2 | D1 | I_det |
|----|----|----|----|-------|
| 0  | 0  | 0  | 1  | 1*I_unit |
| 0  | 0  | 1  | 1  | 2*I_unit |
| 0  | 1  | 1  | 1  | 3*I_unit |
| 1  | 1  | 1  | 1  | 4*I_unit |

FIG. 13
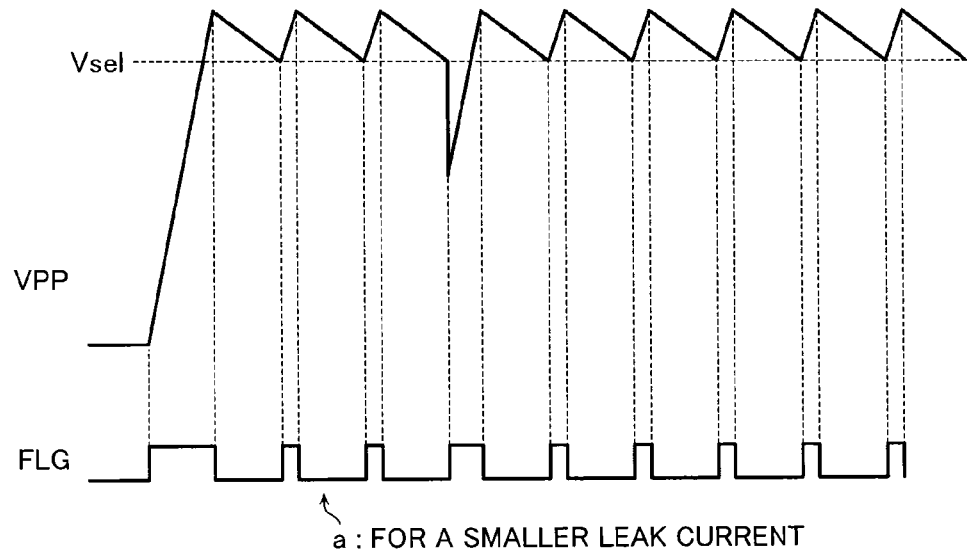
a : FOR A SMALLER LEAK CURRENT
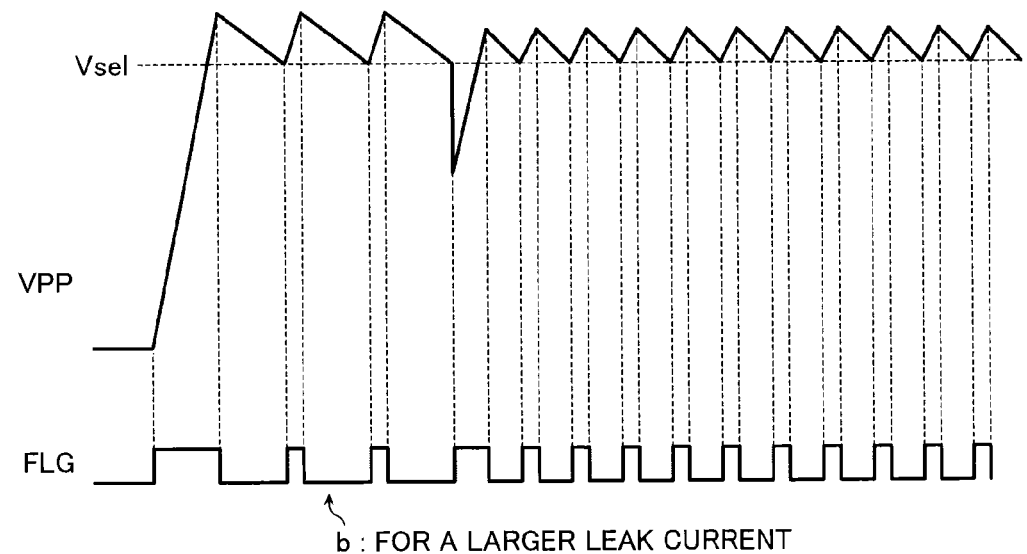
b : FOR A LARGER LEAK CURRENT

FIG. 22

| | | FIRST EMBODIMENT | | SECOND EMBODIMENT | | FIRST MODIFIED EXAMPLE OF SECOND EMBODIMENT | | | | SECOND MODIFIED EXAMPLE OF SECOND EMBODIMENT | | | |
|---|---|---|---|---|---|---|---|---|---|---|---|---|---|
| FIRST | PATTERN | FIRST PATTERN | | SECOND PATTERN | | FIRST PATTERN | | | | SECOND PATTERN | | | |
| | DETERMINATION | Good | Bad | Good | Bad | Good | Bad | | | Good | Bad | | |
| SECOND | PATTERN | · | · | · | · | SECOND PATTERN | | | | FIRST PATTERN | | | |
| | DETERMINATION | · | · | · | · | Good | Good | Bad | Bad | Good | Bad | Good | Bad |
| FINAL DETERMINATION | | Good | Bad | Good | Bad | Good | Bad | Bad | Bad | Good | Bad | Bad | Bad |

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2012-016105, filed on Jan. 30, 2012, the entire contents of which are incorporated herein by reference.

FIELD

The embodiments described in the present specification relate to a non-volatile semiconductor memory device.

BACKGROUND

A NAND flash memory is known as an electrically rewritable and highly integratable non-volatile memory device. The NAND flash memory includes a NAND cell unit. The NAND cell unit includes a plurality of memory cells connected in series. The adjacent memory cells share a source/drain diffusion layer. The NAND cell unit has ends connected to a bit-line and a source-line via select gate transistors, respectively. This NAND cell unit configuration can provide a smaller unit cell area and a larger mass storage than the NOR flash memory.

The memory cells of the NAND flash memory each include a semiconductor substrate, a charge accumulation layer (a floating gate electrode) formed on the substrate via a tunnel insulating film, a control gate electrode stacked on the charge accumulation layer via an inter-gate dielectric film. Each memory cell stores data in a non-volatile manner using the charge accumulation state of the floating gate electrode. For example, the binary data storage is performed by setting data "0" as a high threshold voltage state in which electrons are injected into the floating gate electrode and data "1" as a low threshold voltage state in which electrons are discharged from the floating gate electrode. The threshold voltage distribution to be written has recently been divided to provide a multi-level storage such as a four-level or eight-level storage.

Recently, as the minimum processing dimension has become ever smaller and the non-volatile memory device has become more compact, the distance between the word-lines, or between the word-line and the select gate line has become smaller. Smaller distance between the word-lines means that a word-line leak occurs more likely. Therefore, the generation of the word-line leak needs to be checked, and there is a need for a proposed non-volatile semiconductor memory device that can quickly and reliably detect the generation location of the word-line leak.

Unfortunately, in a conventional non-volatile semiconductor memory device, it is necessary to provide, on a chip, a pad and a switch dedicated to the detection of the word-line leak, which is obstacle to the smaller chip area. It is also necessary to detect the word-line leak for each word-line or each block, resulting in the issue of a longer check time.

BRIEF DESCRIPTION OF THE DRAWINGS

FIG. 13 illustrates the relationship between a leak current I and a flag signal FLG.
FIG. 22 is a table showing voltage application patterns of a first modified example and a second modified example according to the second embodiment.

DETAILED DESCRIPTION

Figure 1:
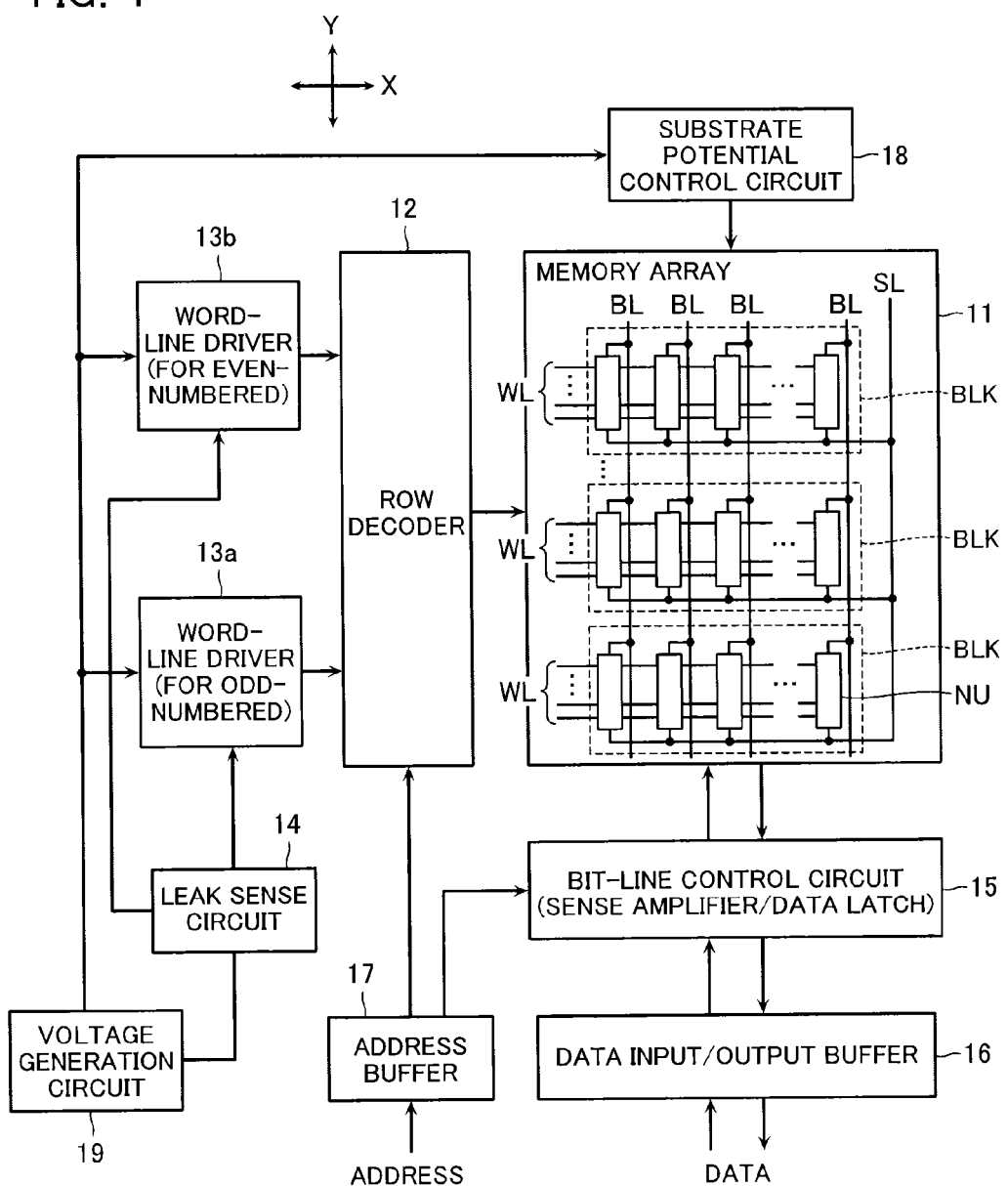
FIG. 1 is a block diagram illustrating a non-volatile semiconductor memory device according to a first embodiment.

A non-volatile semiconductor memory device according to the embodiments described below includes a memory array, a plurality of word-lines, a word line transfer transistor, a control gate line, and a leak sense circuit. The memory array includes a plurality of blocks each including a set of NAND cell units. Each NAND cell unit comprises a memory string including a plurality of memory cells connected in series. Each word-line commonly connects the gates of memory cells arranged in a first direction. The word-line transfer transistor has a first end connected to one of the word-lines. The control gate line has a first end connected to a second end of the word-line transfer transistor. The leak sense circuit performs a leak sense operation of sensing a leak current between the word-lines.

The leak sense circuit includes a limiter circuit, a booster circuit, a leak reference circuit, a counter, and a comparator. The limiter circuit compares a voltage of the control gate line and a set voltage, thereby switching the logic of a flag signal. The booster circuit has a function of boosting the voltage supplied to the control gate line. The booster circuit starts or stops its operation according to the logic of the flag signal. The leak reference circuit has a function of leaking a leak reference current from the control gate line. The counter generates a first count value by counting the number of times a flag signal logic changes in a condition that the word-line transfer transistor is rendered non-conductive and the leak reference circuit is driven, while the counter generates a second count value by counting the number of times the flag signal logic changes in a condition that the word-line transfer transistor is rendered conductive and the leak reference circuit is undriven. The comparator compares the first count value and the second count value.

Referring now to the drawings, the embodiments of a non-volatile semiconductor memory device will be described below.

First Embodiment

Referring to the drawings, a non-volatile semiconductor memory device according to an embodiment will be described in more detail.

First Embodiment

Referring first to FIG. 1, a configuration of a non-volatile semiconductor memory device according to a first embodiment will be described. FIG. 1 is a block diagram of the non-volatile semiconductor memory device according to the first embodiment.

With reference to FIG. 1, the non-volatile semiconductor memory device according to the first embodiment includes a memory array 11, a row decoder 12, word-line drivers 13a, and 13b, a leak sense circuit 14, a bit-line control circuit 15, a data input/output buffer 16, an address buffer 17, a substrate potential control circuit 18, and a voltage generation circuit 19.

With reference to FIG. 1, the memory array 11 includes a plurality of blocks BLK aligned in a y-direction parallel to a substrate. Each block BLK provides a unit for collectively erasing data. Each block BLK includes a set of NAND cell units NU aligned in a x-direction. The set of NAND cell units NU aligned in the x-direction is connected to common word-lines WL. Further, a plurality of NAND cell units NU are aligned in the y-direction over a plurality of blocks BLK. The NAND cell units NU have respective first ends connected to a common bit-line BL. The NAND cell units NU have respective second ends connected to a source-line SL common in the memory array 11.

The row decoder 12 decodes incorporated address and selects a word-line WL. The word-line driver 13a controls the voltages of the odd-numbered word-lines WL via the row decoder 12. The word-line driver 13b controls the voltages of the even-numbered word-lines WL via the row decoder 12. The leak sense circuit 14 performs a leak sense operation of sensing, via the word-line drivers 13a and 13b and the row decoder 12, whether a leak current I_leak flowing between the word-lines WL is equal to or more than a certain value.

The bit-line control circuit 15 controls the voltage of each bit-line BL according to the incorporated address and data. The bit-line control circuit 15 includes a sense amplifier and a data latch. The data input/output buffer 16 receives external data and supplies the data to the bit-line control circuit 15. The data input/output buffer 16 also outputs data out of the bit-line control circuit 15.

The address buffer 17 receives an address from outside and supplies the address to the row decoder 12 and the bit-line control circuit 15. The substrate potential control circuit 18 controls the potential of the substrate in the memory array 11. The voltage generation circuit 19 generates a predetermined voltage, and supplies the voltage to the word-line drivers 13a and 13b, the leak sense circuit 14, and the substrate potential control circuit 18.

Figure 2:
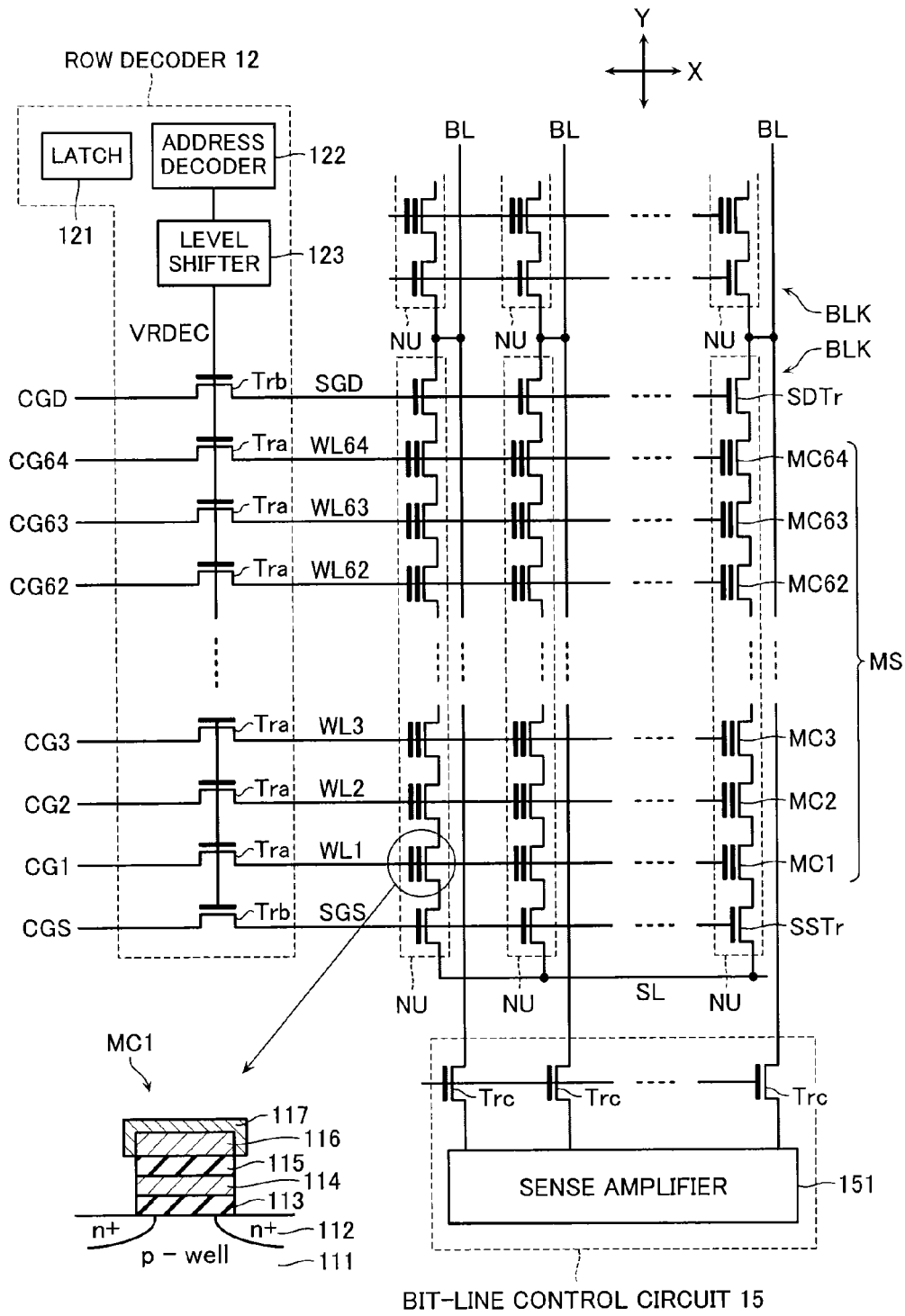
FIG. 2 is a circuit diagram showing a block BLK and a row decoder 12.

Referring now to FIG. 2, the block BLK and the row decoder 12 will be specifically described. With reference to FIG. 2, one block BLK includes NAND cell units NU aligned in the x-direction, as described above. Each NAND cell unit NU includes a memory string MS, the memory string MS including a plurality of memory cells MC1 to MC64 connected in series and select transistors SSTr and SDTr disposed at the respective ends of the memory string MS. Note that the number of memory cells MC in each NAND cell unit NU is not limited to 64.

Each NAND cell unit NU has a first end connected to the source-line SL via the select transistor SSTr and a second end connected to one of the bit-lines BL via the select transistor SDTr. The bit-lines BL are arranged in the x-direction at a predetermined pitch. Each bit-line BL commonly connects first ends of select transistors SDTr arranged in the y-direction.

The gates of the memory cells MC1 arranged in the x-direction are commonly connected to the word-line WL1. The same holds true for the memory cells MC2 to MC64 and the word-lines WL2 to WL64, respectively. The gates of the select transistors SSTr arranged in the x-direction are commonly connected to a select gate line SGS. The gates of the select transistors SSDr arranged in the x-direction are commonly connected to a select gate line SGD.

The stacked structure of the memory cell MC1 will now be described. Note that the stacked structures of the memory cells MC2 to MC64 are similar to the stacked structure of the memory cell MC1, and thus their detailed description is omitted here.

With reference to FIG. 2, the memory cell MC1 includes a p-type well 111, an n-type diffusion layer 112, a tunnel insulating layer 113, a charge accumulation layer 114, a block insulating layer 115, an conductive layer 116, and a silicide layer 117. The p-type well ill is formed on a silicon substrate and functions as the body of the memory cell MC1. The n-type diffusion layer 112 is formed on the p-type well 111 and functions as the source/drain of the memory cell MC1. The tunnel insulating layer 113 is formed on the p-type well 111 over the n-type diffusion layers 112. The charge accumulation layer 114, the block insulating layer 115, and the conductive layer 116 are stacked on the tunnel-insulating layer 113. The silicide layer 117 is provided on the top surface and side surface of the conductive layer 116.

For example, the tunnel-insulating layer 113 and the block-insulating layer 115 are made of silicon dioxide ($SiO_2$), and the charge accumulation layer 114 includes a conductive layer made of, for example, silicon nitride (SiN) or polysilicon. The charge amount held in the charge accumulation layer 114 may be changed by the write operation and the erase operation to change the threshold voltage of the memory cell MC1 in several ways, allowing the memory cell MC1 to store 1-bit data or multi-bit data.

The conductive layer 116 is made of polysilicon. The silicide layer 117 is made of silicide (for example, nickel silicide). The conductive layer 116 and silicide layer 117 function as the gate and word-line WL1 of the memory cell MC1, respectively. The silicide layer 117 may reduce the wiring resistance of the word-line WL1.

With reference to FIG. 2, the row decoder 12 includes a word-line transfer transistor Tra, a transfer transistor Trb, a latch 121, an address decoder 122, and a level shifter 123.

The word-line transfer transistor Tra is provided between the word-lines WL1 to WL64 and control gate lines CG1 to CG64, respectively. The transfer transistor Trb is provided between the select gate line SGS and a control gate line CGS and between the select gate line SGD and a control gate line CGD.

The latch 121 stores an address supplied via the address buffer 17. The latch 121 also stores defective block information. The address decoder 122 decodes an address read from the latch 121 and supplies the address to the level shifter 123. The address decoder 122 also decodes a block address supplied via the address buffer and supplies the decode result to the level shifter 123. The level shifter 123 supplies a signal VRDEC according to the address to the gates of the word-line transfer transistors Tra and the gates of the transfer transistors Trb.

With reference to FIG. 2, the bit-line control circuit 15 includes a bit-line transfer transistor Trc and a sense amplifier 151. The bit-line transfer transistor Trc is provided between one of the bit-lines BL and the sense amplifier 151. The sense amplifier 151 reads data of the memory cells MC1 to MC64 from one of the bit-lines BL via the bit-line transfer transistor Trc.

Figure 3:
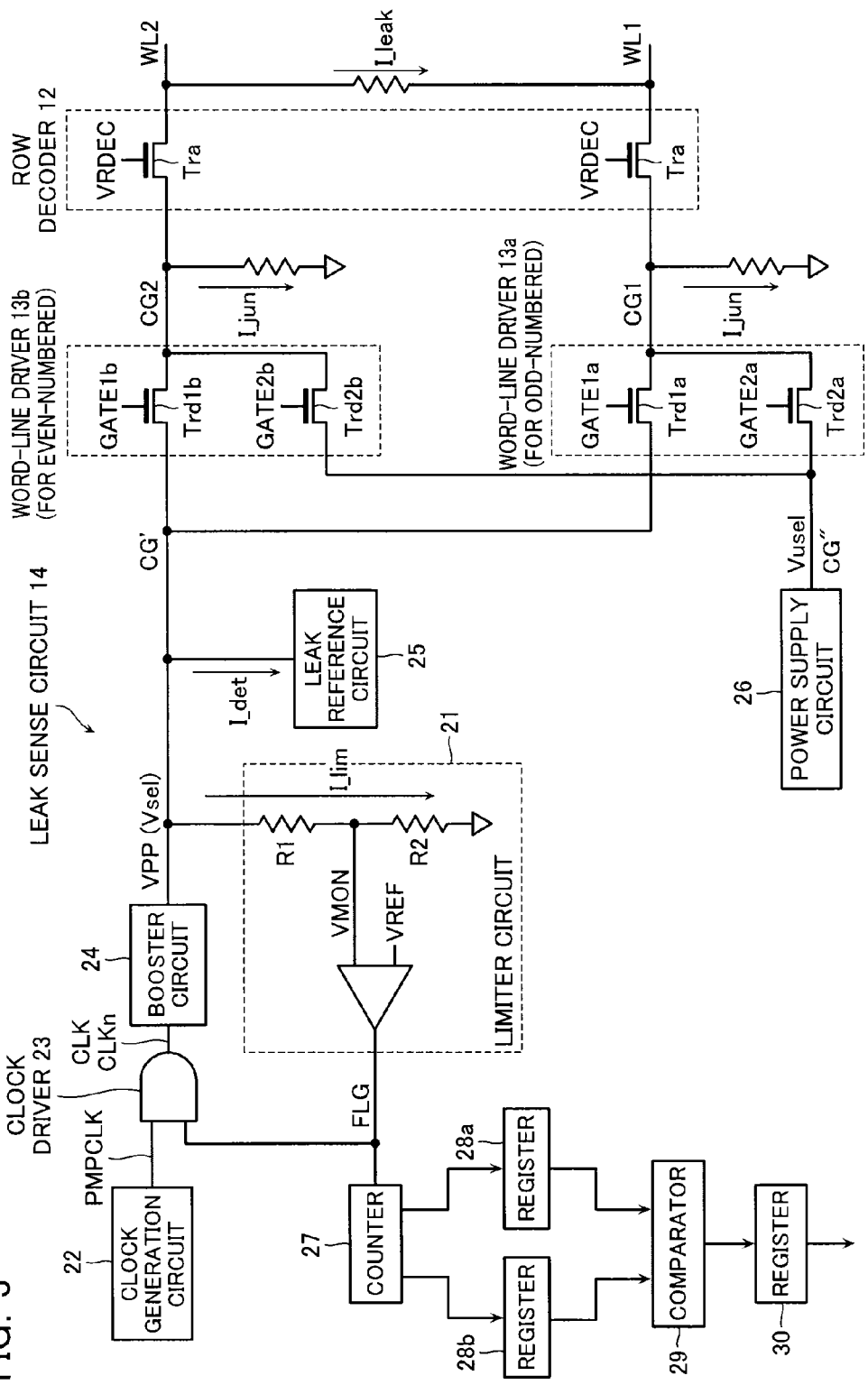
FIG. 3 is a circuit diagram showing a leak sense circuit 14.

Referring now to FIG. 3, the leak sense circuit 14 will be specifically described. In sensing the leak current I_leak between the word-lines WL, the affect of a leak current I_jun from the source/drain diffusion layers of a device such as a transfer transistor needs to be considered. The leak sense circuit 14 in FIG. 3 is configured to be able to sense the leak current I_leak between the word-lines WL by excluding the affect of the leak current I_jun.

The leak sense circuit 14 in FIG. 3 applies different voltages to two adjacent word-lines WLi and WLi+1, and then senses the leak current I_leak flowing between the two adjacent word-lines WLi and WLi+1. With reference to FIG. 3, a description is given of an example where the voltages applied to even-numbered word-lines WLe are higher than the voltages applied to odd-numbered word-lines WLo. It is assumed, for example, that the voltage applied to the word-line WL2 is higher than the voltage applied to the word-line WL1, thereby flowing a leak current I_leak from the word-line WL2 to WL1.

With reference to FIG. 3, the leak sense circuit 14 includes a limiter circuit 21, a clock generation circuit 22, a clock driver 23, a booster circuit 24, a leak reference circuit 25, a power supply circuit 26, a counter 27, registers 28a and 28b, a comparator 29, and a register 30.

The limiter circuit 21 is a circuit that limits the operation of the booster circuit 24 according to the voltage of a wiring line CG'. Specifically, the limiter circuit 21 compares a sense voltage VMON, the sense voltage VMON being derived from the voltage of the wiring line CG' divided by divider resistors of resistors R1 and R2, and a reference voltage VREF, thereby generating a flag signal FLG. The limiter circuit 21 raises the flag signal FLG ("H") if the voltage (a boosted voltage VPP) of the wiring line CG' (a control gate line CG1 or CG2) is below a set voltage Vsel. Meanwhile, the limiter circuit 21 lowers the flag signal FLG ("L") if the voltage VPP of the wiring line CG' (the control gate line CG1 or CG2) is the set voltage Vsel or more. In this example, the set voltage Vsel is set to Vsel=(1+R1/R2) VREF. Note that if a current I_lim flows through the resistors R1 and R2, the flag signal FLG becomes "L" when the amount of the current I_lim is I_lim≥Vsel/(R1+R2).

The clock generation circuit 22 generates a clock signal PMPCLK, and supplies the clock signal PMPCLK to the clock driver 23. The clock driver 23 outputs clock signals CLK and CLKn according to the flag signal FLG and the clock signal PMPCLK.

The booster circuit 24 generates the boosted voltage VPP according to the clock signals CLK and CLKn, and supplies the boosted voltage VPP to the control gate line CG1 or CG2 via the wiring line CG'. The booster circuit 24 boosts the voltage VPP if the flag signal FLG is raised, while the booster circuit 24 stops the boosting of the voltage VPP if the flag signal FLG is lowered. Here, a transfer transistor Trd1a in the word-line driver 13a is provided between the wiring line CG' and the control gate line CG1. A transfer transistor Trd1b in the word-line driver 13b is provided between the wiring line CG' and the control gate line CG2. The gates of the transfer transistors Trd1a and Trd1b are supplied with signals GATE1a and GATE1b, respectively.

The leak reference circuit 25 leaks, when it is driven, a leak reference current I_det from the wiring line CG' (the control gate line CG1 or CG2), and stops, when it is undriven, the leak from the wiring line CG' (the control gate line CG1 or CG2). The power supply circuit 26 supplies a predetermined voltage Vusel (for example, 3V) to the control gate line CG1 via a wiring line CG" and a transfer transistor Trd2a in the word-line driver 13a. The power supply circuit 26 supplies a predetermined voltage Vusel to the control gate line CG2 via the wiring line CG" and a transfer transistor Trd2b in the word-line driver 13b. Note that the gates of the transfer transistors Trd2a and Trd2b are supplied with signals GATE2a and GATE2b, respectively.

The counter 27 counts the number of times the logic of the flag signal FLG changes. Here, the number of times the logic of the flag signal FLG changes may be the number of times the level of the flag signal FLG changes from "L" to "H," or the number of times it changes from "H" to "L," or both. Each of the registers 28a and 28b stores the count value of the counter 27. The comparator 29 compares the count values stored in the registers 28a and 28b. The register 30 stores a comparison result of the comparator 29. The comparison result stored in the register 30 is used to sense the leak current between the word-lines WL.

Figure 4:
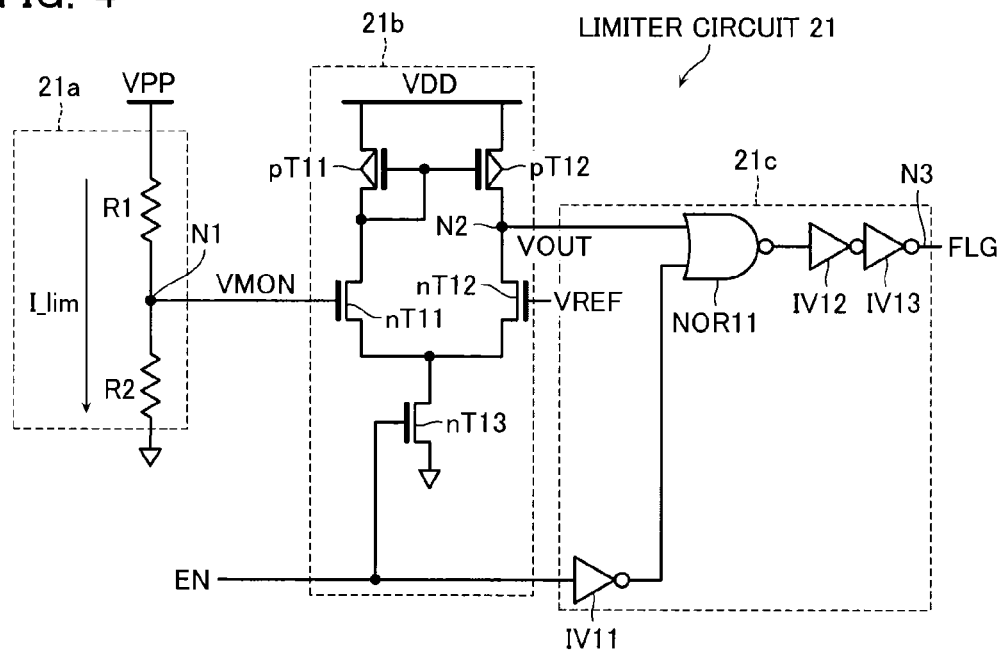
FIG. 4 is a circuit diagram showing a limiter circuit 21.

Referring now to FIG. 4, an example configuration of the limiter circuit 21 will be described. With reference to FIG. 4, the limiter circuit 21 includes a voltage divider circuit 21a, a differential amplification circuit 21b, and a logic circuit 21c. The voltage divider circuit 21a allows a leak of a limiter current I11m from the wiring line CG', and divides the voltage VPP of the wiring line CG' to generate the sense voltage VMON. The voltage divider circuit 21a includes the resistors R1 and R2 connected in series between the wiring line CG' and the ground terminal. The voltage of the connection node N1 between the resistors R1 and R2 is output to the differential amplification circuit 21b as the sense voltage VMON.

The differential amplification circuit 21b differentially amplifies the reference voltage VREF and the sense voltage VMON and outputs a voltage VOUT. The differential amplification circuit 21b includes PMOS transistors pT11 and pT12 and NMOS transistors nT11 to nT13. The PMOS transistors pT11 and pT12 are current-mirror connected, and their sources are supplied with a power supply voltage VDD. The drains of the NMOS transistors nT11 and nT12 are connected to the drains of the PMOS transistors pT11 and pT12, respectively. The voltage of the connection node N2 between the NMOS transistor nT12 and the PMOS transistor pT12 is output as the voltage VOUT. The gate of the NMOS transistor nT11 is supplied with the sense voltage VMON. The gate of the NMOS transistor nT12 is supplied with the reference voltage VREF. The drain of the NMOS transistor nT13 is connected to the sources of the NMOS transistors nT11 and nT12. The source of the NMOS transistor nT13 is grounded. The gate of the NMOS transistor nT13 is supplied with an enable signal EN. The enable signal EN is a signal that becomes "H" when the leak sense circuit 14 is driven.

The logic circuit 21c outputs the flag signal FLG according to the signal VOUT and the enable signal EN. The logic circuit 21c includes a NOR gate NOR11 and inverters IV11 to IV13. The NOR gate NOR11 has a first input terminal receiving the output signal VOUT and a second input terminal receiving the enable signal EN via the inverter IV11. The inverters IV12 and IV13 are connected in series to the output terminal of the NOR gate NOR11. The output terminal N3 of the inverter IV13 outputs the flag signal FLG.

Figure 5:
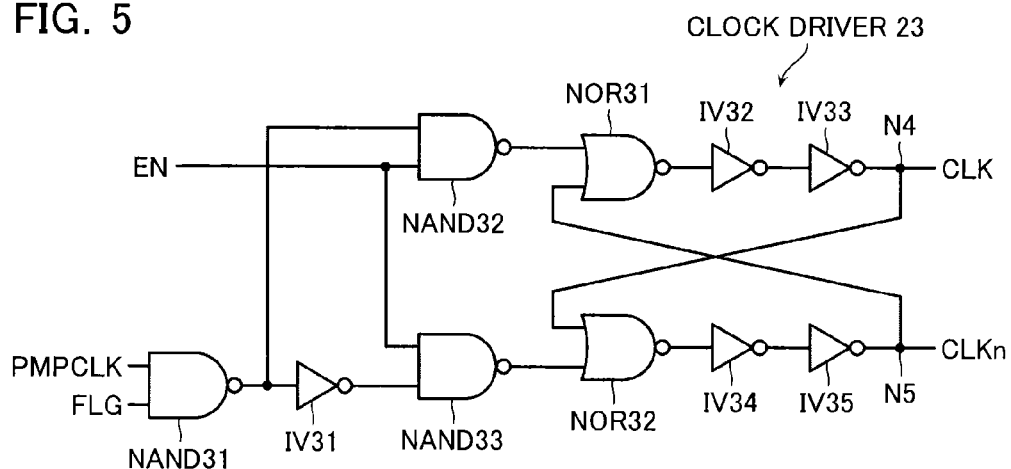
FIG. 5 is a circuit diagram showing a clock driver 23.

Referring now to FIG. 5, an example of the clock driver 23 will be described. With reference to FIG. 5, the clock driver 23 includes NAND gates NAND31 to NAND33, NOR gates NOR31 and NOR32, and inverters IV31 to IV35.

The NAND gate NAND31 has input terminals receiving the clock signal PMPCLK and the flag signal FLG. The NAND gate NAND32 has a first input terminal receiving the enable signal EN and a second input terminal connected to the output terminal of the NAND gate NAND31. The NAND gate NAND33 has a first input terminal receiving the enable signal EN and a second input terminal connected to the output terminal of the NAND gate NAND31 via the inverter IV31. The NAND gate NAND32 has an output terminal connected to a first input terminal of the NOR gate NOR31. The NAND gate NAND33 has an output terminal connected to a first input terminal of the NOR gate NOR32.

The inverters IV32 and 1V33 are cascade-connected between the output terminal of the NOR gate NOR31 and the node N4. The output terminal (node N4) of the inverter IV33 outputs the clock signal CLK. Further, the inverters IV34 and IV35 are cascade-connected between the output terminal of the NOR gate NOR32 and the node N5. The output terminal (node N5) of the inverter IV35 outputs the clock signal CLKn. Further, the output terminal (node N4) of the inverter IV33 is connected to a second input terminal of the NOR gate NOR32. The output terminal (node N5) of the inverter IV35 is connected to a second input terminal of the NOR gate NOR31.

Figure 6:
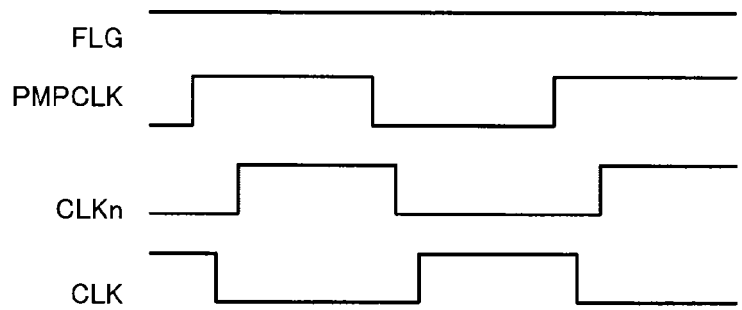
FIG. 6 is a timing chart showing the operation of the clock driver 23.

For example, with reference to FIG. 6, when the flag signal FLG is "H," the clock driver 23 outputs the clock signals CLK and CLKn having different timing and phases according to the signal PMPCLK.

Figure 7:
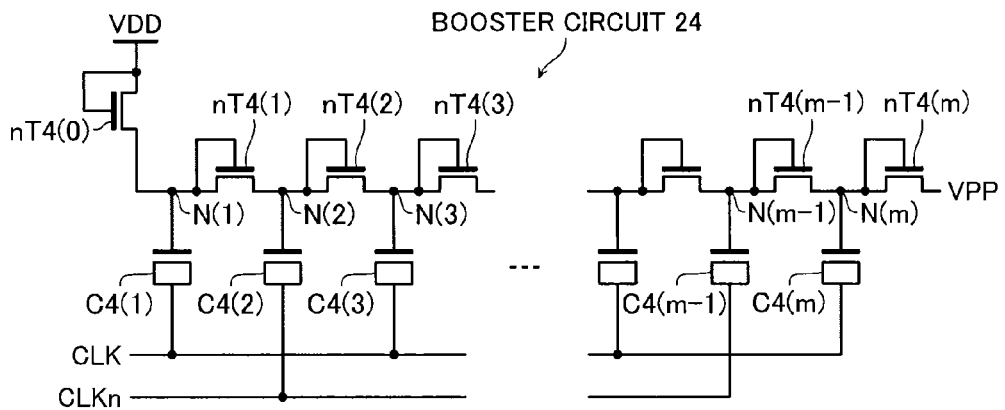
FIG. 7 is a circuit diagram showing a booster circuit 24.

Referring now to FIG. 7, an example of the booster circuit 24 will be described. With reference to FIG. 7, the booster circuit 24 generates the boosted voltage VPP by charging and discharging from capacitors C4 (1) to C4 (m). The boosted voltage VPP is controlled by the above limiter circuit 21 to be the set voltage Vsel. The booster circuit 24 includes NMOS transistors nT4 (0) to nT4 (m) and the capacitors C4 (1) to C4 (m).

The NMOS transistors nT4 (0) to nT4 (m) are diode-connected in series. The NMOS transistor nT4 (0) has a drain supplied with the power supply voltage VDD. The NMOS transistor nT4 (m) has a source outputting the boosted voltage VPP. First ends of the capacitors C4 (1) to C4 (m) are connected to connection nodes N (1) to N (m), respectively. The connection nodes N (1) to N (m) are provided between the NMOS transistors nT4 (0) and nT4 (m). Second ends of the odd-numbered capacitors C are supplied with the clock signal CLK. Second ends of the even-numbered capacitors C are supplied with the clock signal CLKn.

Figure 8:
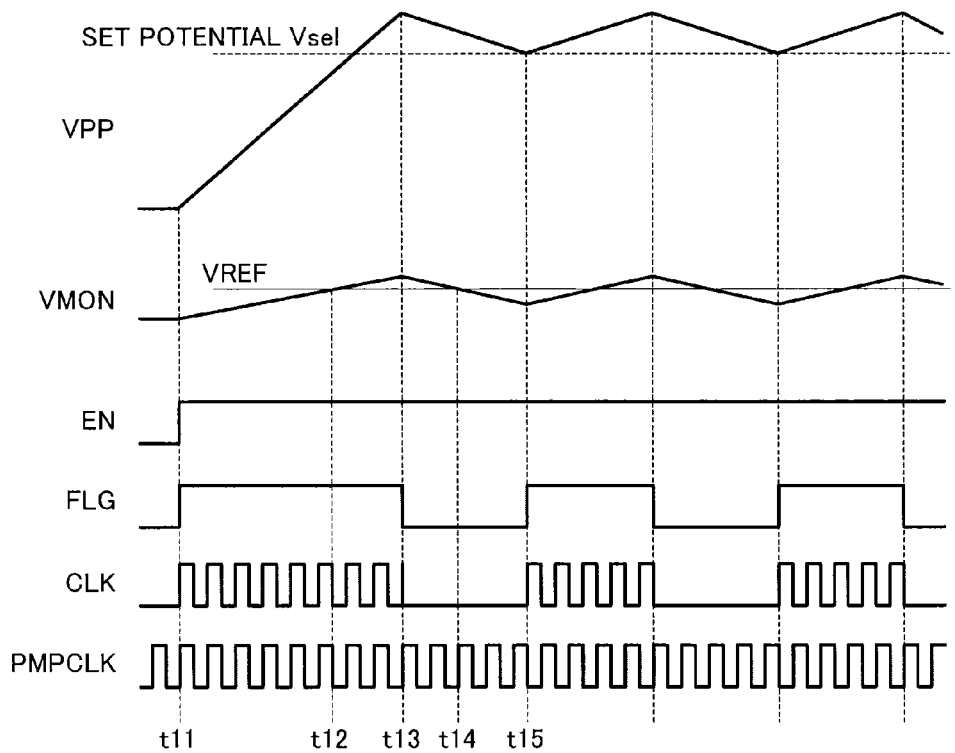
FIG. 8 is a timing chart showing the operation of the booster circuit 24.

With the above configuration, the booster circuit 24 operates as follows. With reference to FIG. 8, the enable signal EN becomes "H" at time t11. Then, the sense voltage VMON is less than or equal to the reference voltage VREF, the flag signal FLG becomes "H," which causes the booster circuit 24 to start the boost operation of the voltage VPP.

Then at time t12, the sense voltage VMON is higher than the reference voltage VREF, at time t13 after a predetermined period elapses, the flag signal FLG becomes "L," which stops the boosting of the voltage VPP. Then at time t14, the sense voltage VMON is less than or equal to the reference voltage VREF again, then at time t15, the flag signal FLG becomes "H" again, which restarts the boosting of the voltage VPP. At time t15 or later, the above process is repeated, thereby holding the boosted voltage VPP near the set voltage Vsel (for example, 15 V).

Figures 9, 10:
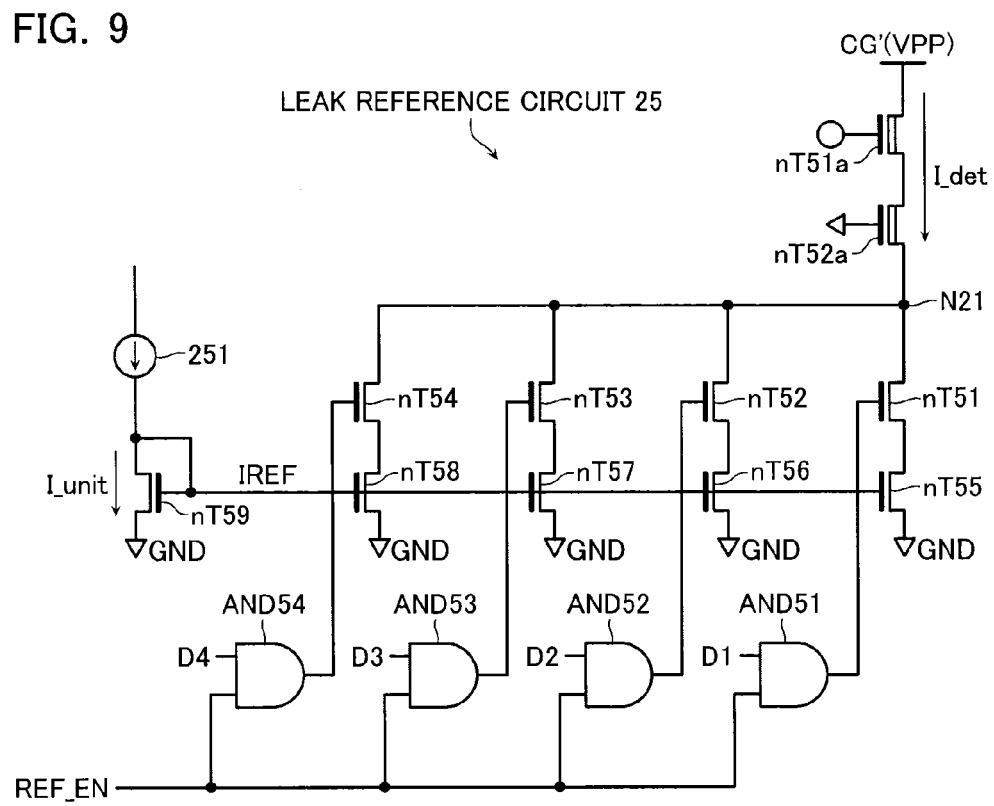
FIG. 9 is a circuit diagram showing a leak reference circuit 25.
FIG. 10 is a table showing an example of a leak reference current I_det.

Referring now to FIG. 9, an example of the leak reference circuit 25 will be described. With reference to FIG. 9, the leak reference circuit 25 leaks, when it is driven, the leak reference current I_det from the wiring line CG'. The leak reference circuit 25 includes NMOS transistors nT51a and nT52a, NMOS transistors nT51 to nT59, a current source 251, and AND gates AND51 to AND54.

The NMOS transistors nT51a and nT52a are connected in series between the wiring line CG' and the node N21. Further, the drain of the NMOS transistor nT51a is connected to the wiring line CG'. The NMOS transistors nT51a and nT52a are high breakdown voltage transistors and are provided to protect the other NMOS transistors nT51 to nT59.

The drains of the NMOS transistors nT51 to nT54 are connected to the source of the NMOS transistor nT52a. The NMOS transistors nT55 to nT58 are current-mirror connected to the NMOS transistor nT59. The NMOS transistors nT55 to nT58 are also connected between the source of the NMOS transistors nT51 to nT54 and the ground terminal GND, respectively. Thus, the NMOS transistors nT55 to nT58 draw the current I_unit flowing through the NMOS transistor nT59. The NMOS transistor nT59 is provided between the current source 251 and the ground terminal GND.

First input terminals of the AND gates AND51 to AND54 are commonly supplied with an enable signal REF_EN. Second input terminals of the AND gates AND51 to AND54 are supplied with respective signals D1 to D4. Further, the output terminals of the AND gates AND51 to AND54 are connected to the gates of the NMOS transistors nT51 to nT54, respectively. The enable signal REF_EN is set to "H" if the leak reference circuit 25 is driven. For example, with reference to FIG. 10, if the enable signal REF_EN is set to "H," the leak reference current I_det is set to be able to change between 1*I_unit and 4*I_unit depending on how many of the signals D1 to D4 are set to "H."

Figure 11:
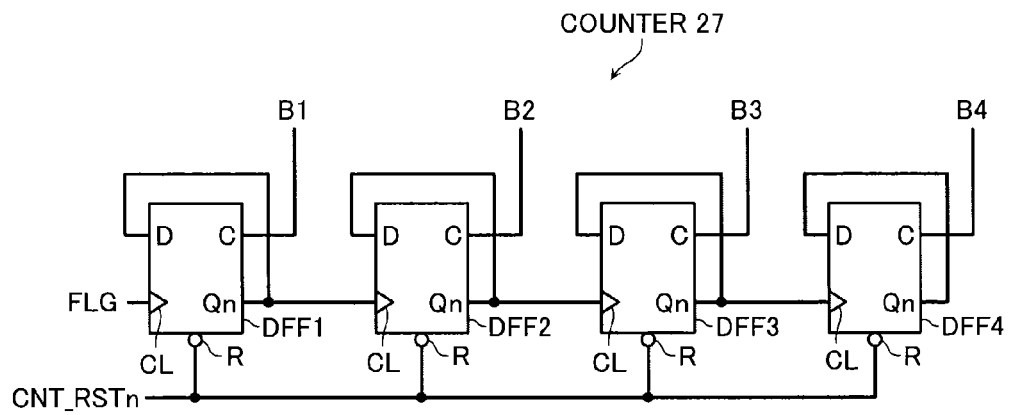
FIG. 11 is a circuit diagram showing a counter 27.

Referring now to FIG. 11, an example of the counter 27 will be described. With reference to FIG. 11, the counter 27 is a 4-bit counter having four D-flip-frop circuits DFF1 to DFF4. Each of the D-flip-frop circuits DFF1 to DFF4 includes a reset terminal R, a clock terminal CL, a data input terminal D, a non-inverted output terminal C, and an inverted output terminal Qn.

The clock terminal CL of the flip-frop circuit DFF1 receives the flag signal FLG. The clock terminals CL of the flip-frop circuits DFF2 to DFF4 are connected to the inverted output terminals Qn of the flip-frop circuits DFF1 to DFF3, respectively. The data input terminals D of the flip-frop circuits DFF1 to DFF4 are connected to their inverted output terminals Qn.

Figure 12:
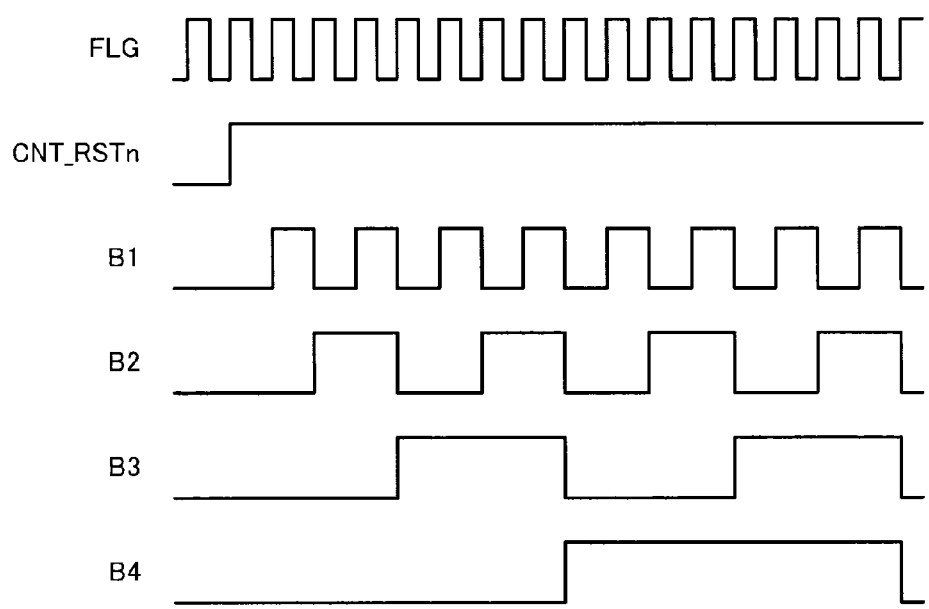
FIG. 12 is a timing chart showing the operation of the counter 27.

Further, the reset terminals R of the flip-frop circuits DFF1 to DFF4 are supplied with a reset signal CNT_RSTn. The non-inverted output terminals C of the flip-frop circuits DFF1 to DFF4 output binary signals B1 to B4, respectively. For example, with reference to FIG. 12, when the reset signal CNT_RSTn is "H," the number of logic changes of the flag signal FLG is counted, thereby changing the binary signals B1 to B4.

Referring now to FIG. 13, the relationship between the leak current and the flag signal FLG will be described. Reference number "a" of FIG. 13 corresponds to a smaller leak current. Reference number "b" of FIG. 13 corresponds to a larger leak current.

With reference to reference number "a" of FIG. 13, for a smaller leak current, the voltage value of the boosted voltage VPP drops at a lower speed. Therefore, the boosted voltage VPP is boosted at a lower frequency, thereby decreasing the number of logic changes of the flag signal FLG. Meanwhile, with reference to reference number "b" of FIG. 13, for a larger leak current, the voltage value of the boosted voltage VPP drops at a higher speed. Therefore, the boosted voltage VPP is boosted at a higher frequency, thereby increasing the number of logic changes of the flag signal FLG. Therefore, this embodiment counts the number of logics of the flag signal FLG to sense the leak current.

The leak current includes, however, the leak current I_leak between the word-lines WL1 and WL2 as well as the above leak current I_jun to the diffusion layer. In this embodiment, the control shown in FIG. 14 to FIG. 17 may provide a leak sense operation of sensing only the leak current I_leak between the word-lines WL by excluding the affect from the leak current I_jun.

Figure 14:
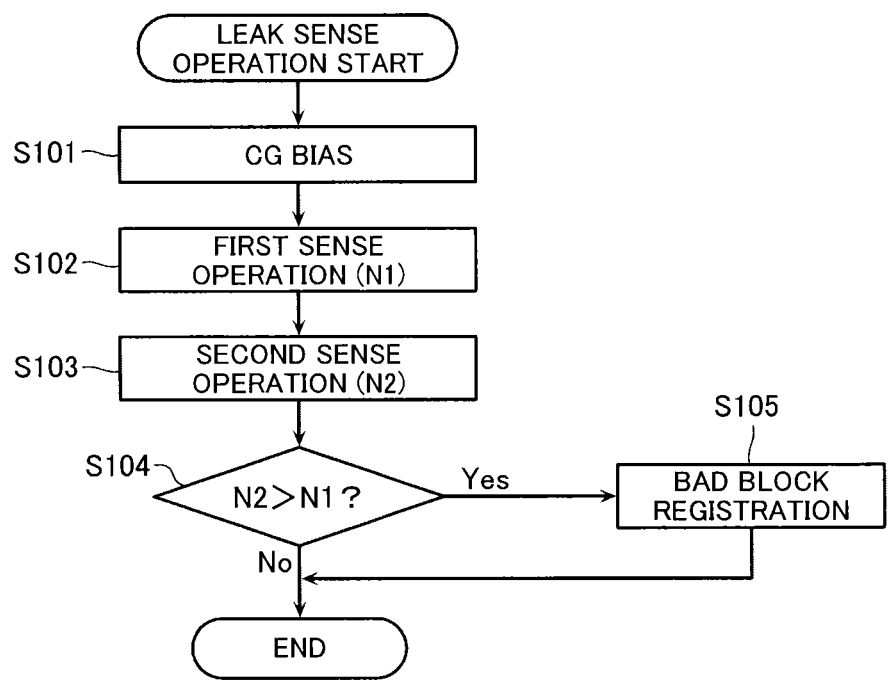
FIG. 14 is a flowchart showing the leak sense operation according to the first embodiment.

FIG. 14 is a flowchart showing the execution procedure of the leak sense operation according to this embodiment. In this embodiment, two sense operations of a first sense operation (S102) and a second sense operation (S103) are performed to exclude the affect of the leak current I_jun to the diffusion layer.

Figure 15:
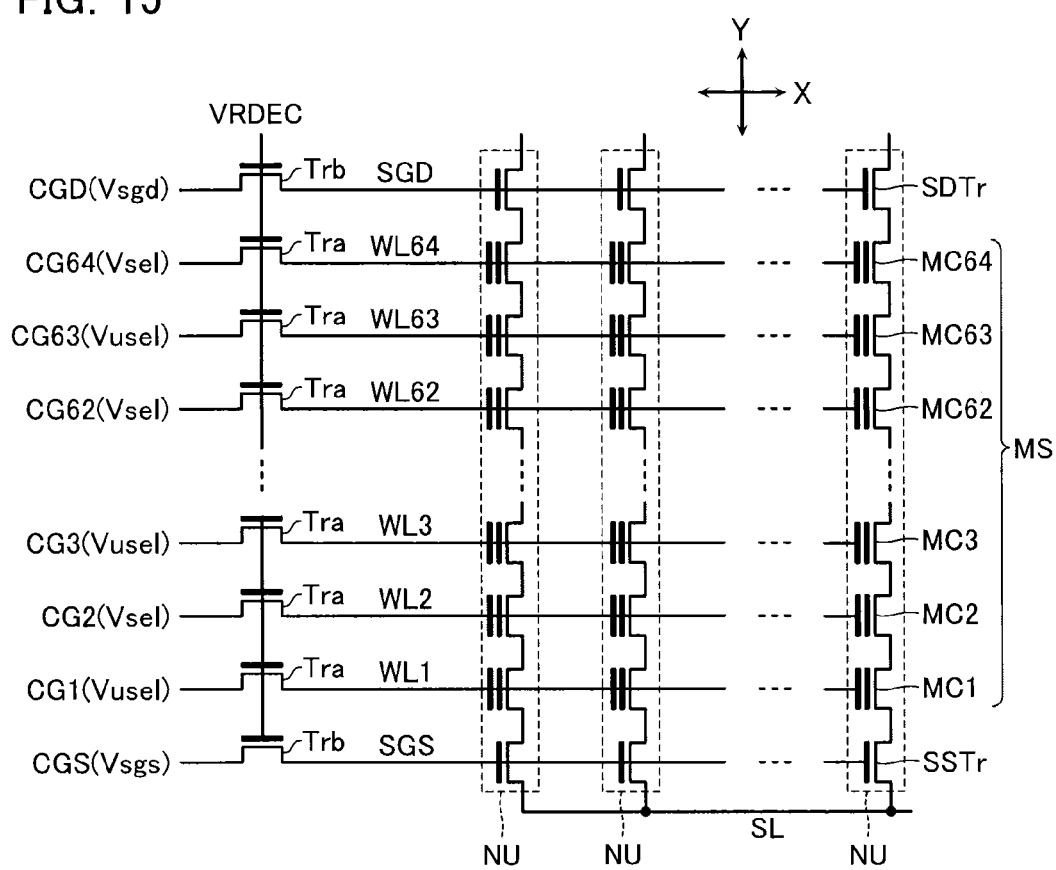
FIG. 15 schematically illustrates the operation of step S101 according to the first embodiment.
Figure 16:
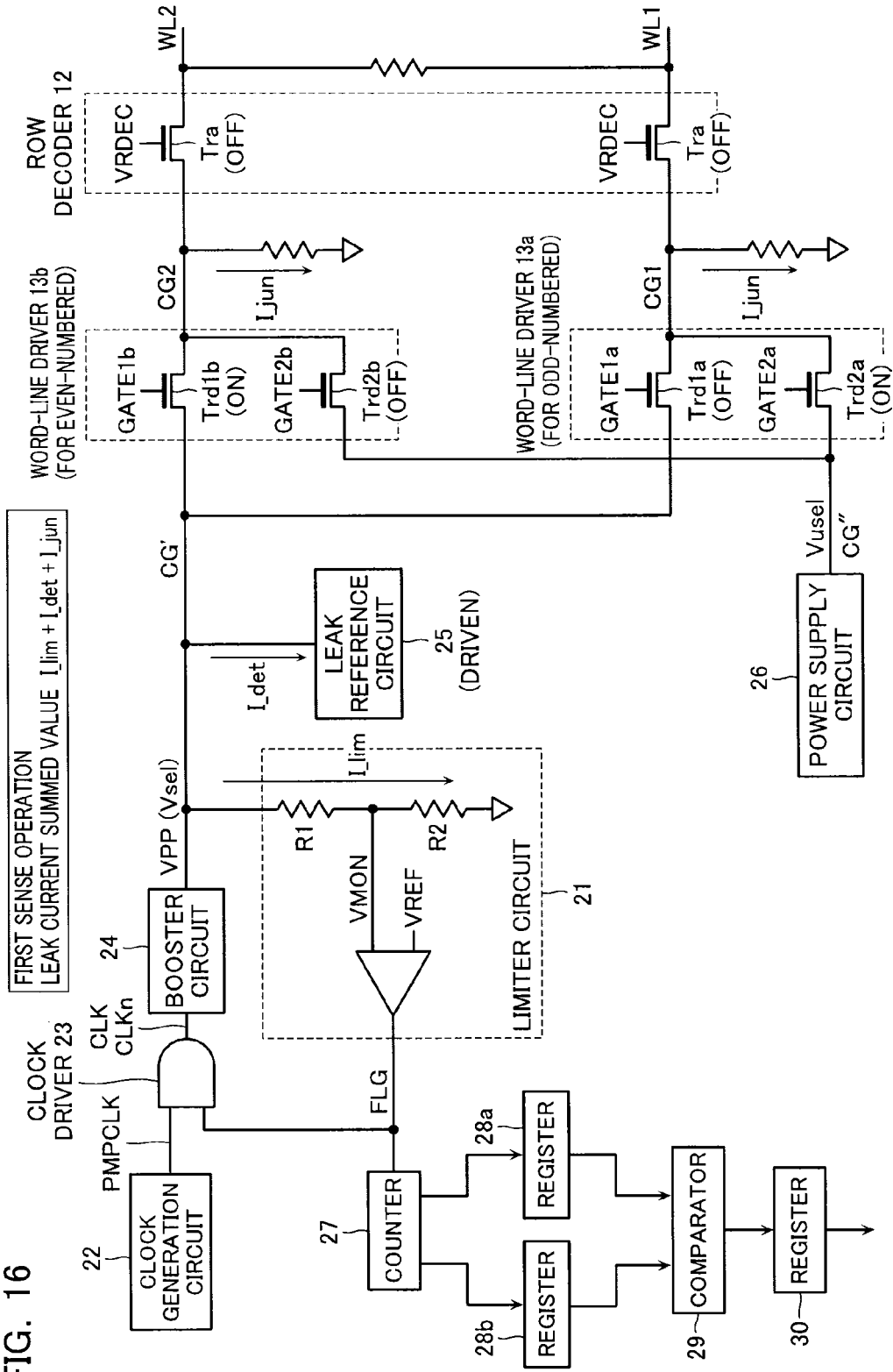
FIG. 16 schematically illustrates a first sense operation according to the first embodiment.
Figure 17:
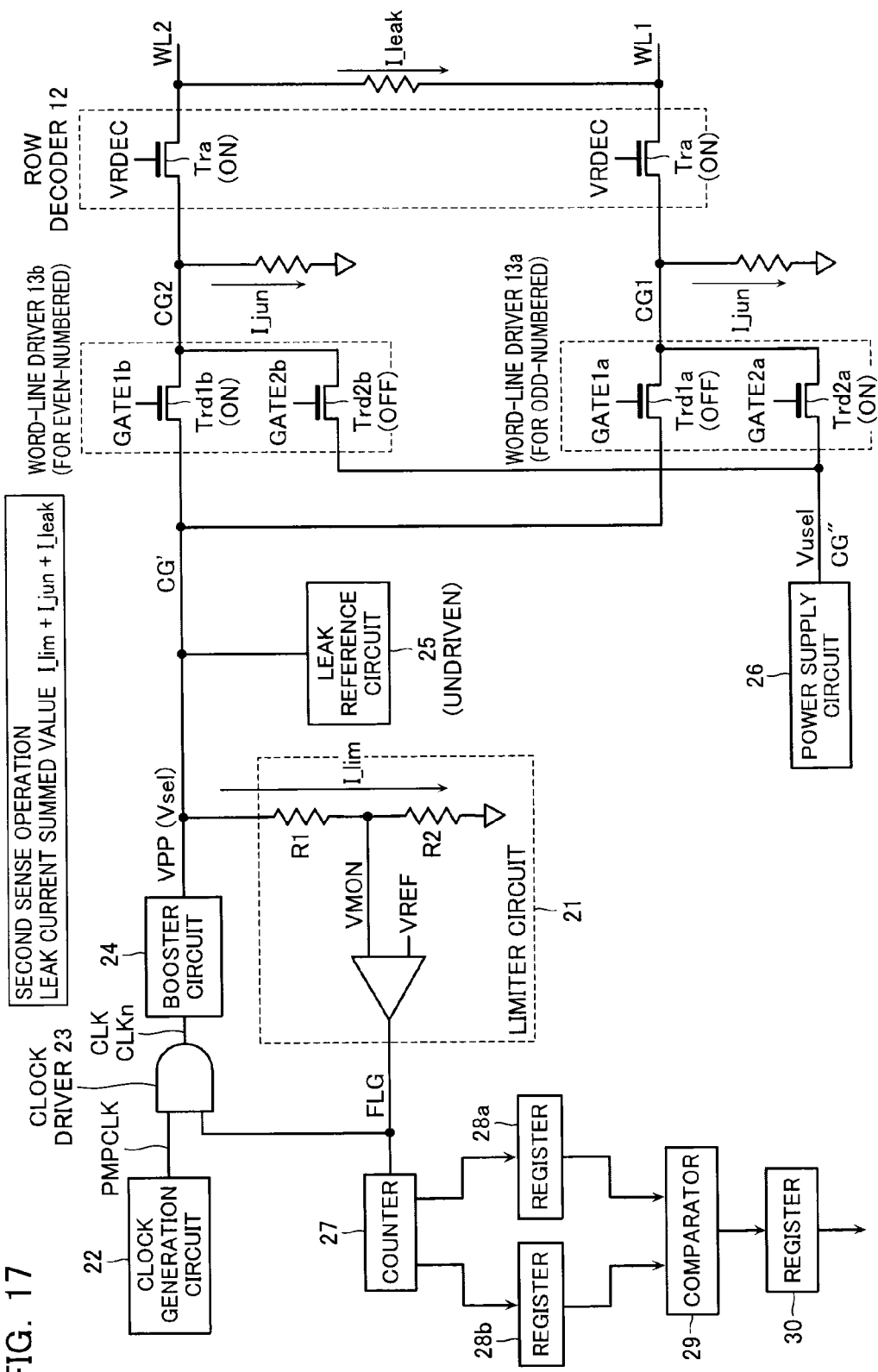
FIG. 17 schematically illustrates a second sense operation according to the first embodiment.

FIG. 14 shows a leak sense operation in which the leak sense circuit 14 first applies different voltages to the odd-numbered and even-numbered control gate lines CG (S101). With reference to FIG. 15, here by way of example, the control gate line CGD is applied with a voltage Vsgd (for example, 2.2 V), and the control gate line CGS is applied with a voltage vsgs (for example, 0 v). Then, the odd-numbered control gate lines CG1, CG3, . . . are applied with the voltage Vusel (for example, 3 V), and the even-numbered control gate lines CG2, CG4, . . . are applied with the voltage Vsel (for example, 15 V).

Then, the first sense operation is performed (S102). In so doing, the leak sense circuit 14 counts the number of logic changes (for example, the change from "L" to "H") of the flag signal FLG to generate a count value N1. Here, with reference to FIG. 16, in the first sense operation, the transfer transistors Trd2a and Trd1b are rendered conductive (ON), while the transfer transistors Trd1a and Trd2b are rendered non-conductive (OFF). Further, the word-line transfer transistor Tra and the transfer transistor Trb are rendered non-conductive (OFF). Thus, the voltage Vusel from the power supply circuit 26 is transferred to the control gate line CG1, but not transferred to the word-line WL1. In addition, the boosted voltage VPP (Vsel) is transferred to the control gate line CG2, but not transferred to the word-line WL2. In this way, in the first sense operation, none of the word-lines WL1 and WL2 are applied with a voltage. The first sense operation is performed to exclude the affect from the leak current I_jun by taking the difference from the second sense operation.

In the first sense operation, the leak current I_jun occurs, but the leak current I_leak does not occur. Further, in the first sense operation, the leak reference circuit 25 is driven, thereby generating the leak reference current I_det. Therefore, in the first sense operation, the count value N1 of the number of logic changes of the flag signal FLG is a value proportional to the summed value (I_μm+I_det+I_jun) of the limiter current I_μm, the leak reference current I_det, and the leak current I_jun. Note that the count value N1 is stored in the register 28a.

Then, with reference to FIG. 14, after step S102, the second sense operation is performed (S103). The leak sense circuit 14 counts the number of logic changes of the flag signal FLG to generate a count value N2 (S103). Here, with reference to FIG. 17, in the second sense operation, the conduction states of the transfer transistors Trd1a, Trd2a, Trd1b, and Trd1b are set similar to the conduction states in the first sense operation, while the word-line transfer transistor Tra and the transfer transistor Trb are rendered conductive (ON). Thus, the voltage Vusel from the power supply circuit 26 is transferred to the control gate line CG1 and the word-line WL1. Further, the boosted voltage VPP (Vsel) is transferred to the control gate line CG2 and the word-line WL2. Thus, both of the leak currents I_jun and I_leak occur. Further, in the second sense operation, the leak reference circuit 25 is undriven and thus the leak reference current I_det does not occur. Therefore, in the second sense operation, the count value N2 of the number of logic changes of the flag signal FLG is a value proportional to the summed value (I_lim+I_jun+I_leak) of the limiter current I_μm, the leak current I_jun, and the leak current I_leak. Note that the count value N2 is stored in the register 28b.

Then, with reference to FIG. 14, after step S103, the comparator 29 determines whether the count value N2 is more than the count value N1 (S104). Then, the register 30 stores the comparison result of the comparator 29. If the count value N2 is less than or equal to the count value N1 (N2 N1) (No in S104), there is no short circuit between the word-lines WL. It is thus determined that the target block BLK is normal, and the process is ended. In contrast, if the count value N2 is more than the count value N1 (N2>N1) (Yes in S104), there is a short circuit between the word-lines WL. The target block BLK is thus registered as a defective block (Bad Block) (S105). Then, an access to the defective block is limited. Also, the comparison result of the comparator 29 may be read out from the register 30, and may be outputted outside.

In the above step S104, the count value N1 is proportional to the summed value (I_μm+I_det+I_jun), and the count value N2 is proportional to the summed value (I_μm+I_jun+I_leak). Thus, by comparing the count value N1 and the count value N2, the leak reference current I_det and the leak current I_leak may be compared in terms of magnitude. Specifically, if the count value N2 is less than or equal to the count value N1 (N2≤N1) (No in S104), it is determined that the leak current I_leak is less than or equal to the leak reference current I_det.

In contrast, if the count value N2 is more than the count value N1 (N2>N1) (Yes in S104), it is determined that the leak current I_leak is more than the leak reference current I_det. As described above, this embodiment may exclude the affect of the limiter current I_lim and the leak current I_jun, and sense only the amount of the leak current I_leak between the word-lines WL.

Figure 18:
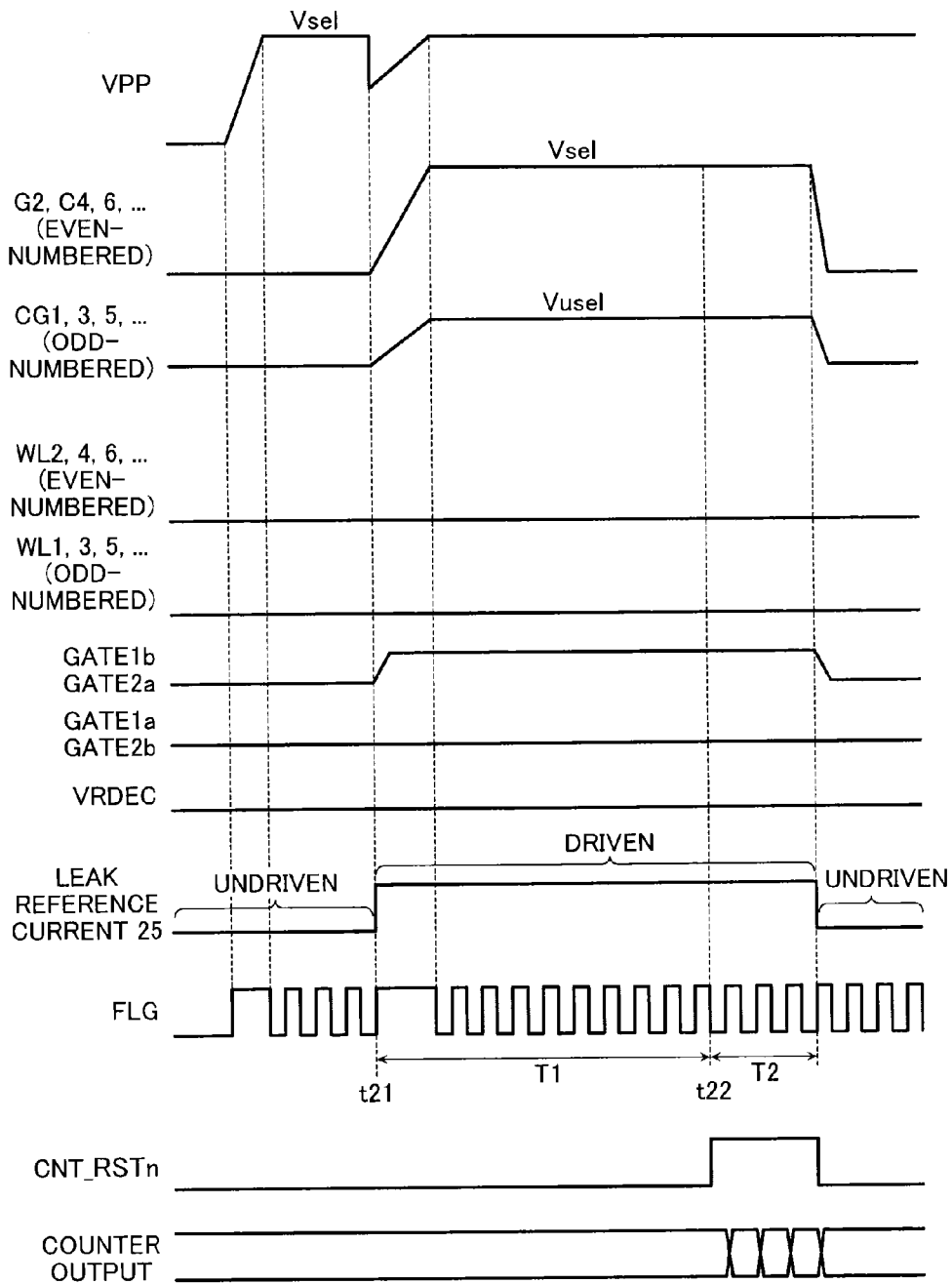
FIG. 18 is a timing chart showing the first sense operation according to the first embodiment.

Referring now to FIG. 18, the above step S102 in FIG. 14 (the first sense operation) will be specifically described. With reference to FIG. 18, at time t21, the signals GATE1b and GATE2a are set to "H," which renders the transfer transistors Trd1b and Trd2a conductive. Thus, the odd-numbered control gate lines CG1, CG3, CG5, . . . are applied with the voltage Vusel (for example, 3V), while the even-numbered control gate lines CG2, CG4, CG6, . . . are applied with the voltage Vsel (for example, 15V). Further, at time t21, the signals D1 to D4 are selectively set to "H," thereby driving the leak reference circuit 25. Then, at time t22 after a predetermined time T1 elapses from time t21, the reset signal CNT_RSTn is set to "H" for a predetermined time T2. Thus, the number of logic changes of the flag signal FLG is counted for time T2.

Figure 19:
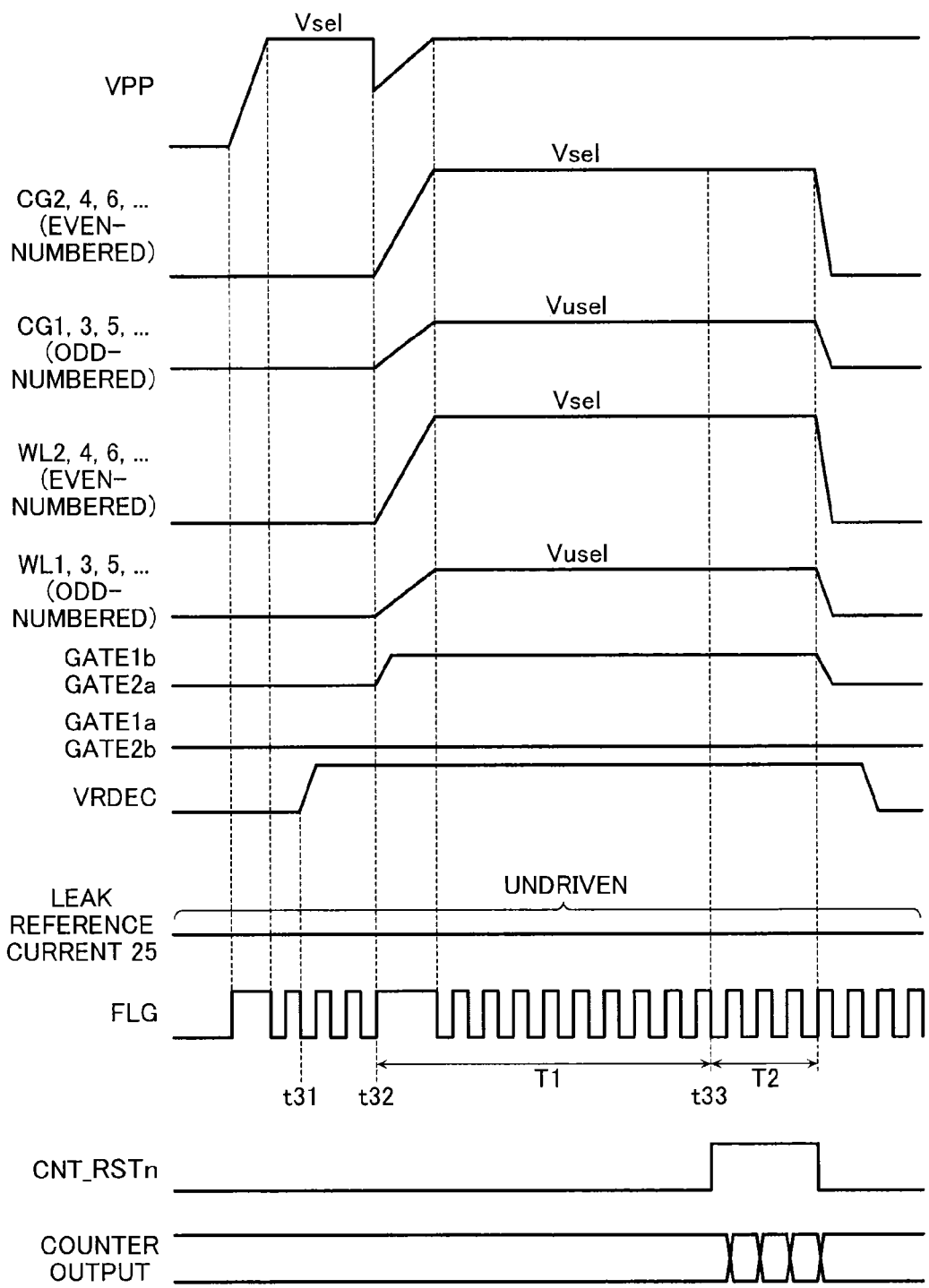
FIG. 19 is a timing chart showing the second sense operation according to the first embodiment.

Referring now to FIG. 19, the above step S103 in FIG. 14 (the second sense operation) will be specifically described. With reference to FIG. 19, at time t31, the signal VRDEC is set to "H," which renders the word-line transfer transistor Tra and the transfer transistor Trb conductive. Then, at time t32, the signals GATE1*b* and GATE2*a* are set to "H," which renders the transfer transistors Trd1*b* and Trd2*a* conductive. Thus, the odd-numbered control gate lines CG1, CG3, CG5, . . . and the word-lines WL1, WL3, WL5, . . . are applied with the voltage Vusel (for example, 3V), while the even-numbered control gate lines CG2, CG4, CG6, . . . and the word-lines WL2, WL4, WL6, . . . are applied with the voltage Vsel (for example, 15V). Note that in the second sense operation, the leak reference circuit 25 remains undriven. Then, at time t33 after a predetermined time T1 elapses from time t32, the reset signal CNT_RSTn is set to "H" for a predetermined time T2. Thus, the number of logic changes of the flag signal FLG is counted for time T2.

Thus, with the leak sense operation, this embodiment may eliminate the necessity of a special pad or switch for the detection of the leak current I_leak between the word-lines WL, and may quickly and reliably detect the generation location of the leak current I_leak. This embodiment may also detect the leak current I_leak by excluding the affect of the leak current I_jun from the diffusion layer of the transfer transistor. Also, this embodiment may read out the comparison result of the comparator 29 from the register 30, and may output the comparison result outside.

Second Embodiment

Figure 20:
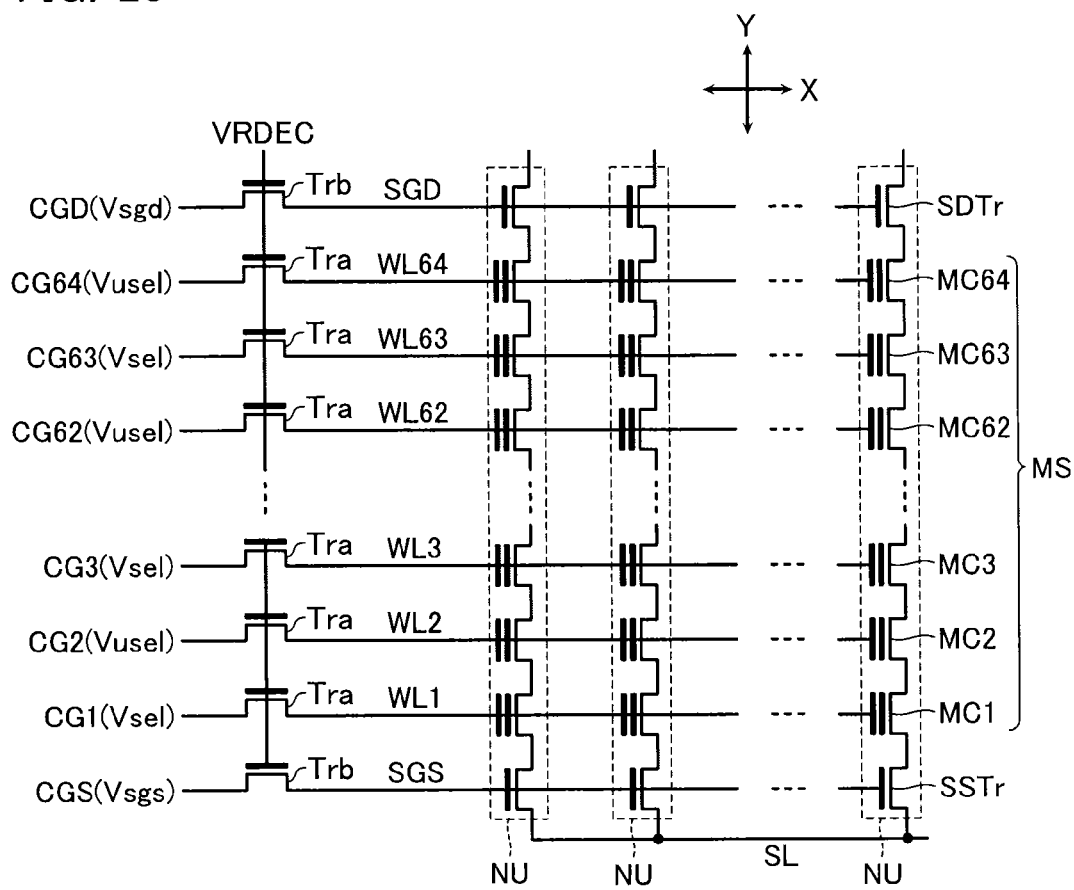
FIG. 20 illustrates a voltage application pattern of the leak sense operation according to a second embodiment.

Referring now to FIG. 20, a non-volatile semiconductor memory device according to a second embodiment will be described. With reference to FIG. 20, in the second embodiment, in the leak sense operation, the odd-numbered control gate lines CG1, CG3, CG5, . . . are applied with the voltage Vsel (for example, 15V), while the even-numbered control gate lines CG2, CG4, CG6, . . . are applied with the voltage Vusel (for example, 3V). In other words, in the second embodiment, the polarities of the voltage applied to the odd-numbered control gate lines CG1, CG3, and CG5 and the voltage applied to the even-numbered control gate lines CG2, CG4, and CG6 are opposite to those in the first embodiment. Other configurations are similar to those in the first embodiment and thus their description is omitted in the second embodiment.

Figure 21:
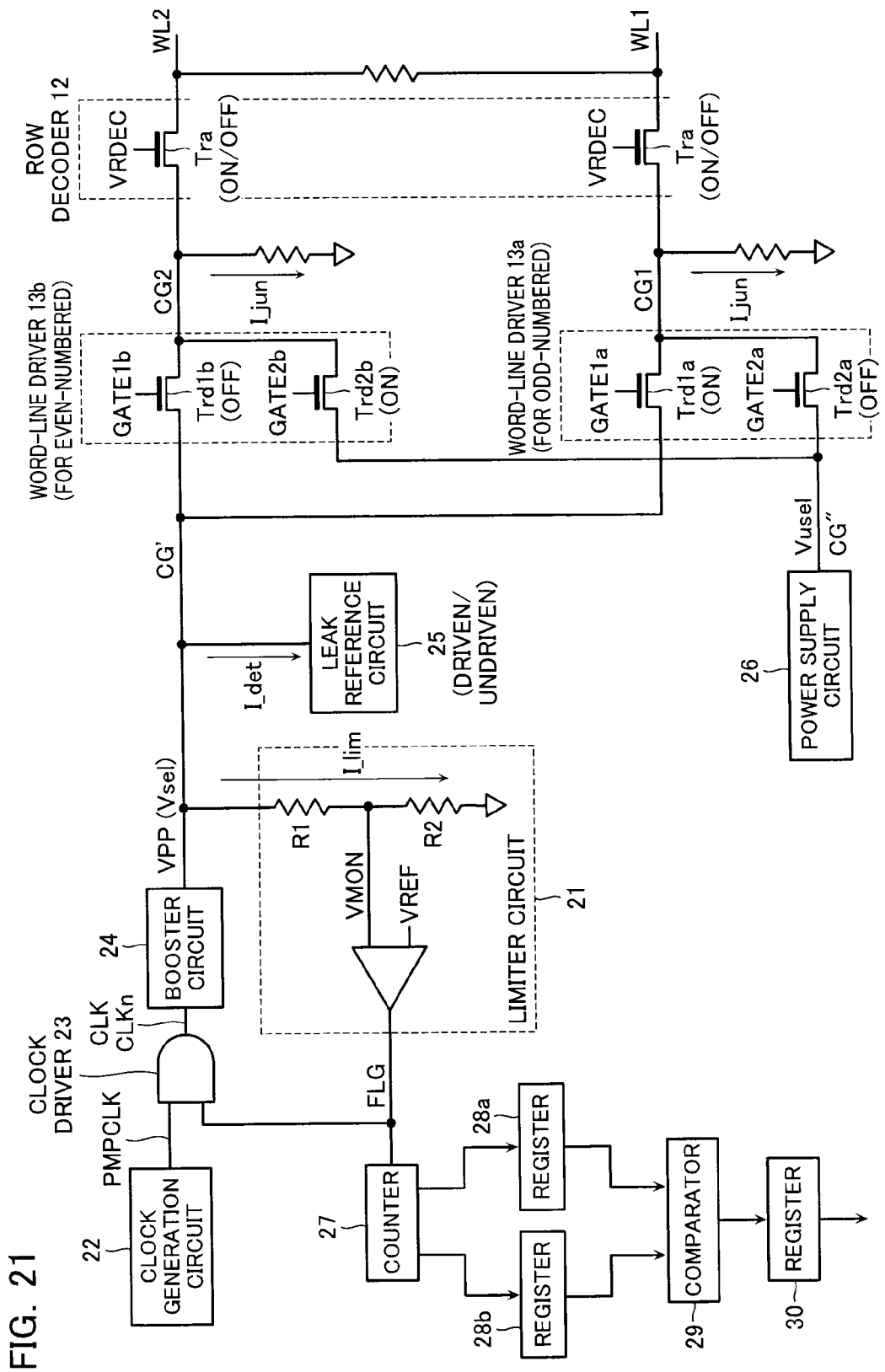
FIG. 21 schematically illustrates the leak sense operation according to the second embodiment.

The voltage control of the control gate line CG according to the second embodiment is performed as shown in FIG. 21. Specifically, with reference to FIG. 21, in the first leak sense operation and the second leak sense operation, the transfer transistors Trd1*a* and Trd2*b* are rendered conductive (ON), and the transfer transistors Trd1*a* and Trd1*b* are rendered non-conductive (OFF).

Modified Example

A first modified example and a second modified example of the second embodiment will now be described. As described above, in the first embodiment, the odd-numbered control gate lines CG are applied with the voltage Vusel (for example, 3V), while the even-numbered control gate lines CG are applied with the voltage Vsel (for example, 15V) (a first pattern). Further, in the second embodiment, conversely, the odd-numbered control gate lines CG are applied with the voltage Vsel (for example, 15V), while the even-numbered control gate lines CG are applied with the voltage Vusel (for example 3V) (a second pattern).

In contrast, in the first modified example and the second modified example of the second embodiment, a leak sense operation using the first pattern and a leak sense operation using the second pattern are performed, and the results of the two leak sense operations are used to perform the leak determination (GOOD or BAD).

In the first modified example, first, the control gate lines CG1 to CG64 are applied with a voltage in "the first pattern" to perform the leak sense operations (the first sense operation (S102) and the second sense operation (S103)). Then, second, the control gate lines CG1 to CG64 are applied with a voltage in "the second pattern" to perform the leak sense operations (the first sense operation (S102) and the second sense operation (S103)).

Further, with reference to FIG. 22, in the second modified example, first, the control gate lines CG1 to CG64 are applied with a voltage in "the second pattern" to perform the leak sense operations (the first and second sense operations). Then, second, the control gate lines CG1 to CG64 are applied with a voltage in "the first pattern" to perform the leak sense operations (the first sense operation (S102) and the second sense operation (S103)).

Then, with reference to FIG. 22, in the first modified example and the second modified example, only if it is determined that there is no short circuit between the word-lines WL in "the first pattern" and "the second pattern" (Good), it is finally determined that there is no short circuit fault between the word-lines WL, otherwise, it is determined that there is a short circuit fault between the word-lines WL (Bad).

Third Embodiment

Figure 23A:
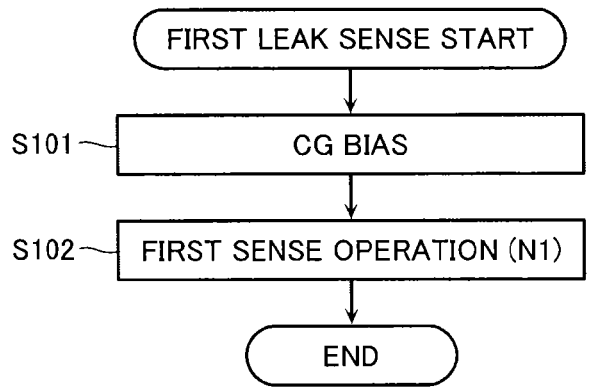
FIG. 23A is a flowchart showing the leak sense operation (a first leak sense operation) according to a third embodiment.
Figure 23B:
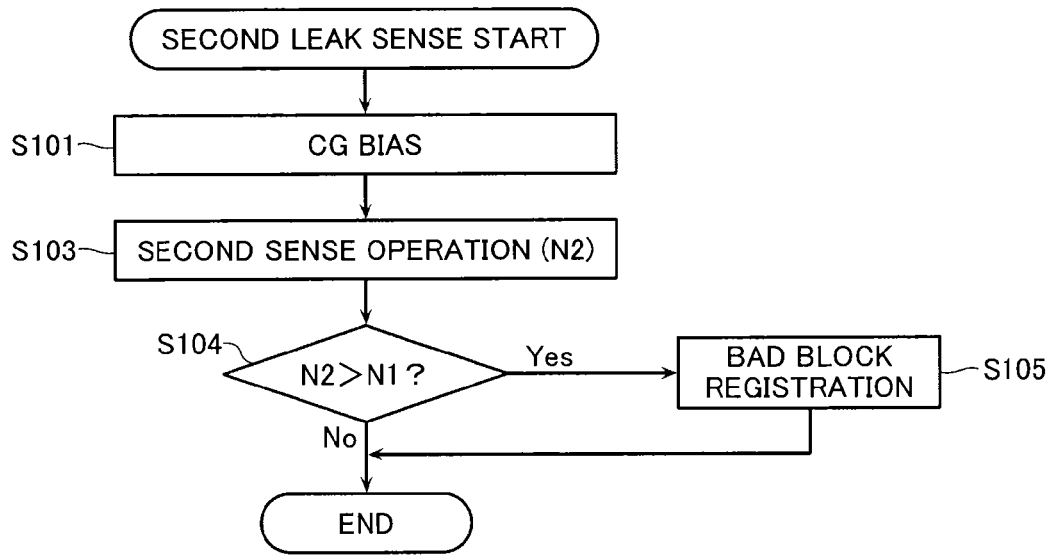
FIG. 23B is a flowchart showing the leak sense operation (a second leak sense operation) according to the third embodiment.

Referring now to FIG. 23A and FIG. 23B, a non-volatile semiconductor memory device according to a third embodiment will be described. In the above first and second embodiments, the first sense operation (S102) and the second sense operation (S103) are successively performed in one leak sense operation (see FIG. 14). In contrast, in the third embodiment, the first sense operation is performed in the first leak sense operation, as shown in FIG. 23A. Then, after the first leak sense operation is ended, the second sense operation is performed in the second leak sense operation, as shown in FIG. 23B.

Specifically, with reference to FIG. 23A, in the first leak sense operation, the operations in steps S101 and S102 are performed as in the first embodiment. Note that in S102, the count value N1 of the number of logic changes of the flag signal FLG is stored in the register 28*a*, as in the first embodiment. Then, after step S102, the first leak sense operation is ended.

Then, in the second leak sense operation, after step S101 is performed, steps S103 to S105 are performed, as shown in FIG. 23B. Then, after step S104 or S105, the second leak sense operation is ended. With the above operations, the leak sense operation time for all blocks BLK in the third embodiment may be less than that in the first embodiment.

Fourth Embodiment

Figure 24:
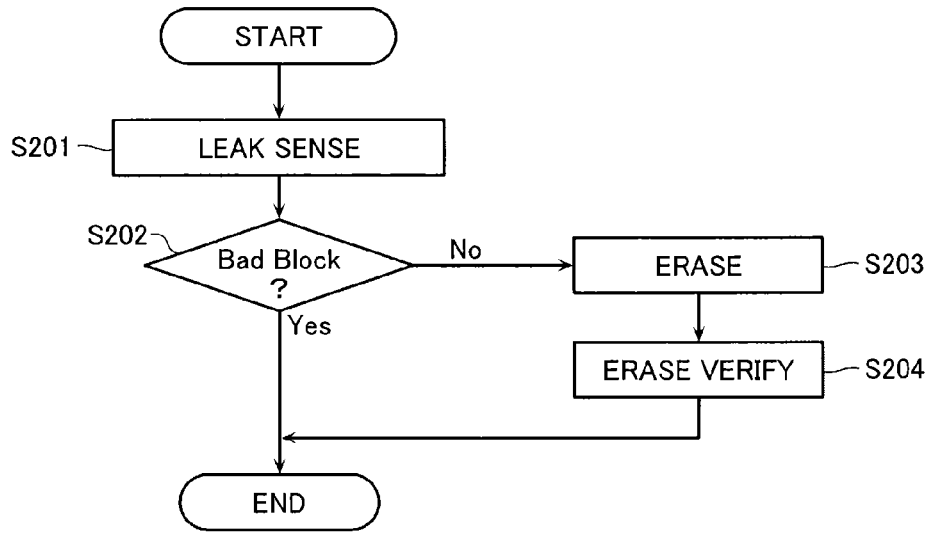
FIG. 24 is a flowchart showing the leak sense operation and the erase operation according to a fourth embodiment.

Referring now to FIG. 24, a non-volatile semiconductor memory device according to a fourth embodiment will be described. In the fourth embodiment, the leak sense operation is performed after the erase command is received and before the erase operation is performed. Only in this point, the fourth embodiment is different from the first embodiment. Note that other configurations according to the fourth embodiment are similar to those in the first embodiment and thus their description is omitted here.

The fourth embodiment performs the operation shown in FIG. 24 after the erase command is received. With reference to FIG. 24, first, the leak sense operation is performed (S201). Then, the leak sense operation result is used to determine whether the target block is a defective block (S202). If it is determined that the target block is a defective block (Yes in S202), the operation is ended without performing the erase operation. In contrast, if, in step S202, it is determined that the target block is not a defective block (No in S202), the erase operation (S203) and the erase verify operation (S204) are performed.

The leak current I_leak between the word-lines WL may be generated immediately after the manufacture as well as gradually increased after the write operation and the erase operation are repeated. Therefore, the leak current I_leak is sensed at a timing before performing the erase operation, and if the leak current I_leak is sensed to be equal to or more than the reference value, the memory block may not be subjected to the erase operation and be directly registered as a bad block. Thus, the useless erase operation may be omitted, thereby improving the performance. In addition, it may be possible to avoid a write fault, a read fault, and an erase fault due to a word-line short circuit generated during the use of the non-volatile semiconductor memory device.

Fifth Embodiment

Figure 25:
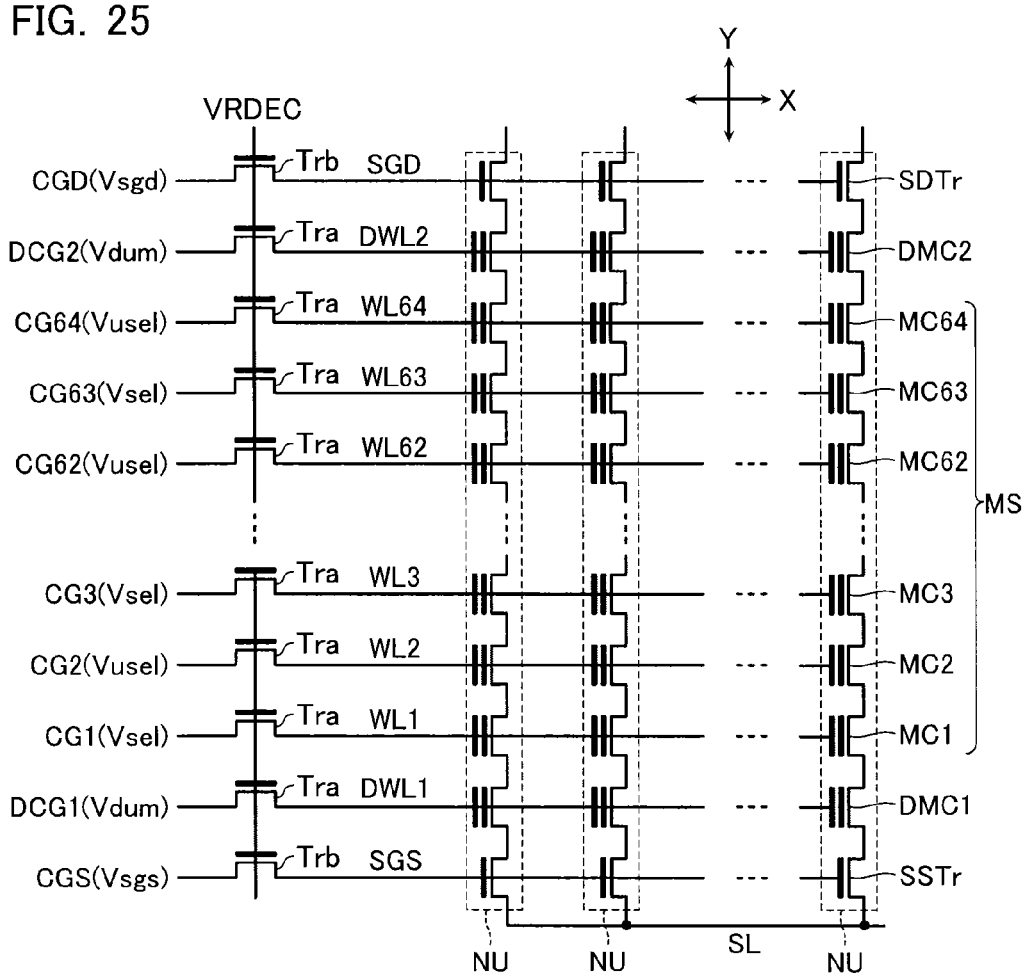
FIG. 25 illustrates a NAND cell unit NU and a voltage application pattern according to a fifth embodiment.

Referring now to FIG. 25, a non-volatile semiconductor memory device according to a fifth embodiment will be described. With reference to FIG. 25, in the fifth embodiment, each NAND cell unit NU includes dummy cells DMC1 and DMC2. In terms of this point and the associated operations, the fifth embodiment is different from the first embodiment. Note that other configurations according to the fifth embodiment are similar to those in the first embodiment and thus their description is omitted here.

With reference to FIG. 25, in the fifth embodiment, the dummy cells DMC1 and DMC2 are provided between the memory string MS and the select transistors SSTr and SDTr, respectively. The gates of the dummy cells DMC1 aligned in the x-direction are commonly connected to a dummy word-line DWL1. The gates of the dummy cells DMC2 aligned in the x-direction are commonly connected to a dummy word-line DLW2. In the leak sense operation, the dummy word-lines DWL1 and DWL2 are applied with a voltage Vdum (for example, 5V) different from the voltage Vsel (for example, 15V) and from the Vusel (for example, 3V).

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 26:
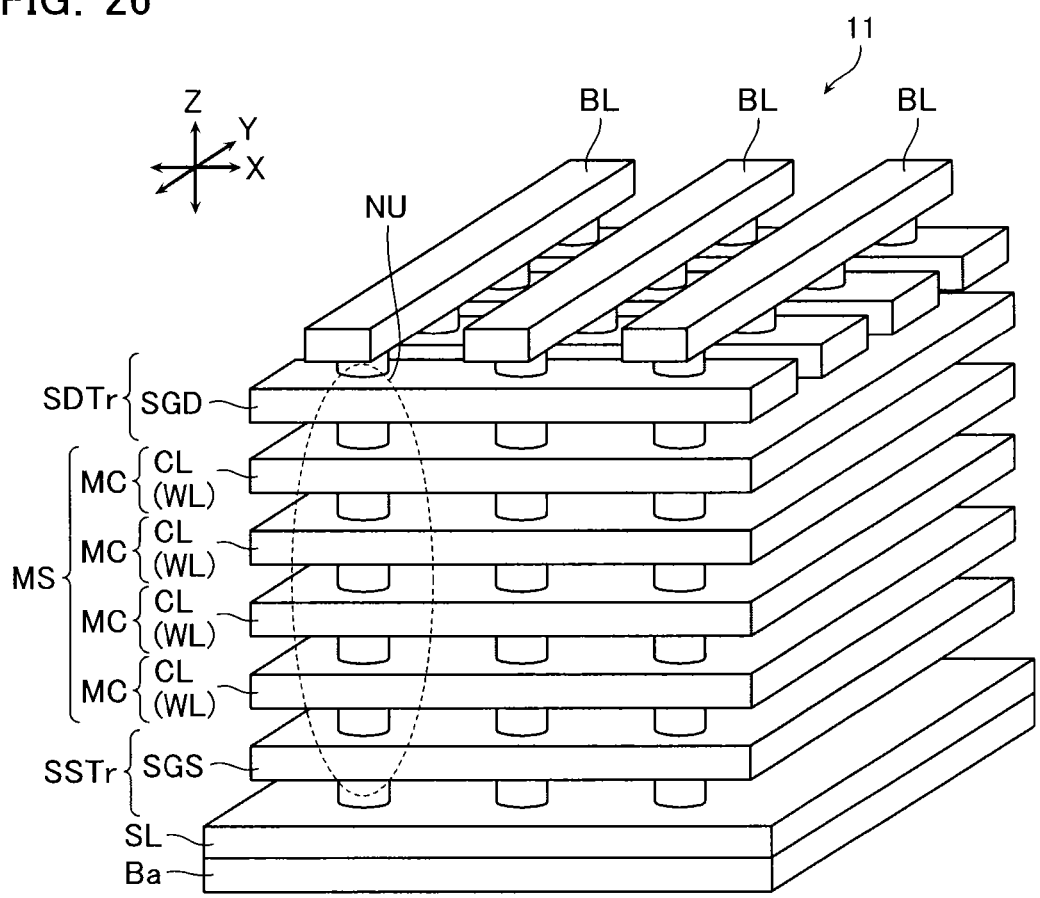
FIG. 26 is a perspective view showing a memory array 11 according to another embodiment.

For example, the leak sense operation may not be performed in the write operation or the erase operation, but may be performed before performing those operations and immediately after the manufacture of the non-volatile semiconductor memory device. Further, although the above embodiments have been described with respect to the memory array 11 of a two-dimensional structure, the invention is not limited thereto and is also applicable to a memory array of a three-dimensional structure. For example, with reference to FIG. 26, a memory array 11 of a three-dimensional structure includes a semiconductor layer SC and a conductive layer CL. The semiconductor layer SC extends in a direction (z-direction) perpendicular to a semiconductor substrate Ba and functions as the bodies of the memory cells MC. The conductive layer CL surrounds a side surface of the semiconductor layer SC via a charge accumulation layer. The conductive layer CL functions as the gates of the memory cells MC and as the word-lines WL.

What is claimed is:

1. A non-volatile semiconductor memory device comprising:
   a memory array comprising a plurality of blocks each comprising a set of NAND cell units, each NAND cell unit comprising a memory string comprising a plurality of memory cells connected in series;
   a plurality of word-lines each commonly connecting gates of memory cells arranged in a first direction;
   a word-line transfer transistor having a first end connected to one of the word-lines;
   a control gate line having a first end connected to a second end of the word-line transfer transistor; and
   a leak sense circuit configured to perform a leak sense operation of sensing a leak current between the word-lines,
   the leak sense circuit comprising:
   a limiter circuit configured to compare a voltage of the control gate line and a set voltage, thereby switching a logic of a flag signal;
   a booster circuit having a function of boosting a voltage supplied to the control gate line, and being configured to start or stop its operation according to the logic of the flag signal;
   a leak reference circuit having a function of leaking a leak reference current from the control gate line;
   a counter configured to generate a first count value by counting the number of times the flag signal logic changes in a condition that the word-line transfer transistor is rendered non-conductive and the leak reference circuit is driven, the counter being configured to generate a second count value by counting the number of times the flag signal logic changes in a condition that the word-line transfer transistor is rendered conductive and the leak reference circuit is undriven; and
   a comparator configured to compare the first count value and the second count value.

2. The non-volatile semiconductor memory device according to claim 1, wherein
   the leak sense circuit is configured to apply, in the leak sense operation, a first voltage and a second voltage alternately to the word-lines arranged in a second direction perpendicular to the first direction, and
   the second voltage is lower than the first voltage.

3. The non-volatile semiconductor memory device according to claim 1, further comprising dummy cells each provided to each of both ends of the memory string, and dummy word-lines each commonly connecting gates of the dummy cells arranged in the first direction, wherein
   the dummy word-lines are applied with a third voltage different from the first voltage and the second voltage.

4. The non-volatile semiconductor memory device according to claim 1, wherein
the leak sense circuit performs the leak sense operation before performing an erase operation of erasing data of the memory cells in each of the blocks.

5. The non-volatile semiconductor memory device according to claim 1, wherein
each of the word-lines comprises a first conductive layer comprising polysilicon and a silicide layer contacting with a side surface of the first conductive layer.

6. The non-volatile semiconductor memory device according to claim 2, wherein
the leak sense circuit performs,
a first pattern operation of applying the second voltage to odd-numbered word-lines arranged in the second direction and applying the first voltage to even-numbered word-lines arranged in the second direction, and
a second pattern operation of applying the second voltage to even-numbered word-lines arranged in the second direction and applying the first voltage to odd-numbered word-lines arranged in the second direction, and wherein
the first pattern operation and the second pattern operation are successively performed in the leak sense operation.

7. The non-volatile semiconductor memory device according to claim 1, further comprising a word-line driver configured to selectively connect the control gate line and the leak sense circuit.

8. The non-volatile semiconductor memory device according to claim 7, further comprising a power supply circuit configured to supply a power supply voltage, wherein
the word-line driver selectively connects the control gate line and the power supply circuit.

9. The non-volatile semiconductor memory device according to claim 1, wherein
the leak reference circuit is configured to be able to adjust the amount of the leak reference current.

10. The non-volatile semiconductor memory device according to claim 1, wherein
each of the memory cells comprises,
a semiconductor layer extending in a direction perpendicular to a substrate, and functioning as a body of a memory cell, and
a second conductive layer provided on a side surface the semiconductor layer via a charge accumulation layer, and functioning as a gate of the memory cell.

11. The non-volatile semiconductor memory device according to claim 1, wherein
the leak sense circuit further comprises a register storing a comparison result of the comparator,
the leak sense circuit is configured to sense the leak current on the basis of the comparison result stored in the register.

12. A non-volatile semiconductor memory device comprising:
a plurality of word-lines each commonly connecting gates of memory cells arranged in a first direction;
a word-line transfer transistor having a first end connected to one of the word-lines;
a control gate line having a first end connected to a second end of the word-line transfer transistor; and
a leak sense circuit configured to perform a leak sense operation of sensing a leak current between the word-lines;
the leak sense circuit comprising:
a limiter circuit configured to compare a voltage of the control gate line and a set voltage, thereby switching a logic of a flag signal;
a booster circuit having a function of boosting a voltage supplied to the control gate line, and being configured to start or stop its operation according to the logic of the flag signal;
a leak reference circuit having a function of leaking a leak reference current from the control gate line;
a counter configured to generate a first count value by counting the number of times the flag signal logic changes in a condition that the word-line transfer transistor is rendered non-conductive and the leak reference circuit is driven, the counter being configured to generate a second count value by counting the number of times the flag signal logic changes in a condition that the word-line transfer transistor is rendered conductive and the leak reference circuit is undriven; and
a comparator configured to compare the first count value and the second count value,
the leak sense circuit being configured to apply, in the leak sense operation, a first voltage and a second voltage alternately to the word-lines arranged in a second direction perpendicular to the first direction, and
the second voltage being lower than the first voltage.

13. The non-volatile semiconductor memory device according to claim 12, further comprising a dummy cells and dummy word-lines each commonly connecting gates of the dummy cells arranged in the first direction, wherein
the dummy word-line are applied with a third voltage different from the first voltage and the second voltage.

14. The non-volatile semiconductor memory device according to claim 12, wherein
the leak sense circuit performs the leak sense operation before performing an erase operation of erasing data of the memory cells.

15. The non-volatile semiconductor memory device according to claim 12, wherein
each of the word-lines comprises a first conductive layer comprising polysilicon and a silicide layer contacting with a side surface of the first conductive layer.

16. The non-volatile semiconductor memory device according to claim 12, wherein
the leak sense circuit performs,
a first pattern operation of applying the second voltage to odd-numbered word-lines arranged in the second direction and applying the first voltage to even-numbered word-lines arranged in the second direction, and
a second pattern operation of applying the second voltage to even-numbered word-lines arranged in the second direction and applying the first voltage to odd-numbered word-lines arranged in the second direction, and
the first pattern operation and the second pattern operation are successively performed in the leak sense operation.

17. The non-volatile semiconductor memory device according to claim 12, further comprising a word-line driver configured to selectively connect the control gate line and the leak sense circuit.

18. The non-volatile semiconductor memory device according to claim 17, further comprising a power supply circuit configured to supply a power supply voltage, wherein
the word-line driver selectively connects the control gate line and the power supply circuit.

19. The non-volatile semiconductor memory device according to claim 12, wherein
the leak reference circuit is configured to be able to adjust the amount of the leak reference current.

20. The non-volatile semiconductor memory device according to claim 12, wherein
each of the memory cells comprises,
a semiconductor layer extending in a direction perpendicular to a substrate, and functioning as a body of a memory cell, and
a second conductive layer provided on a side surface the semiconductor layer via a charge accumulation layer, and functioning as a gate of the memory cell.

* * * * *